United States Patent
Shih

(10) Patent No.: US 11,574,891 B2
(45) Date of Patent: Feb. 7, 2023

(54) SEMICONDUCTOR DEVICE WITH HEAT DISSIPATION UNIT AND METHOD FOR FABRICATING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/158,337

(22) Filed: Jan. 26, 2021

(65) Prior Publication Data

US 2022/0238487 A1 Jul. 28, 2022

(51) Int. Cl.
| H01L 25/065 | (2006.01) |
| H01L 25/18 | (2006.01) |
| H01L 23/498 | (2006.01) |
| H01L 25/00 | (2006.01) |
| H01L 21/48 | (2006.01) |

(52) U.S. Cl.
CPC ........ *H01L 25/0657* (2013.01); *H01L 21/486* (2013.01); *H01L 23/49827* (2013.01); *H01L 25/18* (2013.01); *H01L 25/50* (2013.01); *H01L 2225/06524* (2013.01); *H01L 2225/06541* (2013.01); *H01L 2225/06589* (2013.01)

(58) Field of Classification Search
CPC ............... H01L 25/0657; H01L 21/486; H01L 23/49827; H01L 25/18
See application file for complete search history.

(56) References Cited

U.S. PATENT DOCUMENTS

| 10,026,724 | B2 | 7/2018 | Kim et al. | |
| 10,651,149 | B2 * | 5/2020 | Chen | H01L 23/5386 |
| 10,796,931 | B2 * | 10/2020 | Lin | H01L 24/92 |
| 11,018,066 | B2 * | 5/2021 | Chen | H01L 24/80 |
| 11,069,608 | B2 * | 7/2021 | Chen | H01L 23/5226 |
| 11,075,151 | B2 * | 7/2021 | Tsai | H01L 25/105 |
| 11,107,801 | B2 * | 8/2021 | Jeng | H01L 21/32 |
| 11,257,791 | B2 * | 2/2022 | Chen | H01L 24/80 |
| 11,282,756 | B2 * | 3/2022 | Lee | H01L 23/5386 |
| 11,322,509 | B2 * | 5/2022 | Baraskar | H01L 27/11556 |
| 2020/0373219 | A1 | 11/2020 | Hsu et al. | |

FOREIGN PATENT DOCUMENTS

| TW | 202006890 A | 2/2020 |
| TW | 202013610 A | 4/2020 |
| TW | M-600937 U | 9/2020 |

* cited by examiner

*Primary Examiner* — Thao P Le
(74) *Attorney, Agent, or Firm* — Muncy, Geissler, Olds & Lowe, P.C.

(57) ABSTRACT

The present application discloses a semiconductor device with a heat dissipation unit and a method for fabricating the semiconductor device. The semiconductor device includes a die stack, an intervening bonding layer positioned on the die stack, and a carrier structure including a carrier substrate positioned on the intervening bonding layer, and through semiconductor vias positioned in the carrier substrate and on the intervening bonding layer for thermally conducting heat.

16 Claims, 34 Drawing Sheets

SEMICONDUCTOR DEVICE WITH HEAT DISSIPATION UNIT AND METHOD FOR FABRICATING THE SAME

TECHNICAL FIELD

The present disclosure relates to a semiconductor device and a method for fabricating the semiconductor device, and more particularly, to a semiconductor device with a heat dissipation unit and a method for fabricating the semiconductor device with the heat dissipation unit.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a die stack, an intervening bonding layer positioned on the die stack, and a carrier structure including a carrier substrate positioned on the intervening bonding layer, and through semiconductor vias positioned in the carrier substrate and on the intervening bonding layer for thermally conducting heat.

In some embodiments, the carrier structure includes a bonding layer positioned between the carrier substrate and the intervening bonding layer, and a conductive plate positioned in the bonding layer of the carrier structure and contacting the through semiconductor vias of the carrier structure.

In some embodiments, the die stack includes a first die structure positioned below the intervening bonding layer, and a second die structure positioned below the first die structure.

In some embodiments, the first die structure and the second die structure are memory dies.

In some embodiments, the first die structure is a memory die and the second die structure is a logic die.

In some embodiments, top surfaces of the through semiconductor vias of the carrier structure and a top surface of the carrier substrate are substantially coplanar.

In some embodiments, top surfaces of the through substrate vias of the carrier structure are covered by the carrier substrate.

In some embodiments, the first die structure includes a first substrate positioned opposite to the intervening bonding layer, a first dielectric layer positioned between the first substrate and the intervening bonding layer, a first bonding layer positioned between the first substrate and the second die structure, first interconnection layers positioned in the first dielectric layer, through semiconductor vias of the first die structure positioned along the first substrate and the first bonding layer of the first die structure and electrically connecting the first interconnection layers and the second die structure. The second die structure includes a second substrate positioned opposite to the first bonding layer of the first die structure, a second dielectric layer positioned between the second substrate and the first bonding layer of the first die structure, a first bonding layer of the second die structure positioned below the second substrate, second interconnection layers positioned in the second dielectric layer and electrically connecting to the through semiconductor vias of the first die structure, and through semiconductor vias of the second die structure positioned along the second substrate and the first bonding layer of the second die structure and electrically connecting to the second interconnection layers.

In some embodiments, the semiconductor device includes solder joints electrically connecting to the through semiconductor vias of the second die structure.

In some embodiments, the first die structure includes a second bonding layer positioned between the first bonding layer of the first die structure and the second dielectric layer, and pad layers positioned in the second bonding layer and electrically connecting the second interconnection layers and the through semiconductor vias of the first die structure.

In some embodiments, widths of the pad layers are greater than widths of the through semiconductor vias of the first die structure.

In some embodiments, the semiconductor device includes first dummy through semiconductor vias positioned along the first die structure, the second die structure, and the intervening bonding layer.

In some embodiments, the semiconductor device includes first dummy through semiconductor vias positioned along the first die structure, the second die structure, and the intervening bonding layer, extending to the bonding layer of the carrier structure, and thermally contacting with the conductive plate.

In some embodiments, the semiconductor device includes second dummy through semiconductor vias positioned along the intervening bonding layer and the first dielectric layer and extending to the first substrate.

In some embodiments, widths of the first dummy through semiconductor vias are greater than widths of the second dummy through semiconductor vias.

In some embodiments, the semiconductor device includes third dummy through semiconductor vias positioned along the first die structure and extending to the second die structure.

In some embodiments, the second dummy through semiconductor vias are substantially uniformly distributed in the first die structure.

In some embodiments, the semiconductor device includes a thermal interface layer positioned between the intervening bonding layer and the bonding layer of the carrier substructure. The thermal interface layer is formed of a carbon material imbued with a flexible material.

In some embodiments, the carrier structure includes a bonding layer positioned between the carrier substrate and the intervening bonding layer, and conductive fins positioned in the bonding layer of the carrier structure and contacting with the through semiconductor vias of the carrier structure.

Another aspect of the present disclosure provides a method for fabricating a semiconductor device including providing a carrier substrate, forming through semiconductor vias in the carrier substrate for thermally conducting heat, forming a bonding layer on the carrier substrate, providing a first die structure including through semiconductor vias, forming an intervening bonding layer on the first die structure, bonding the first die structure onto the bonding layer through the intervening bonding layer, and bonding a second die structure onto the first die structure. The carrier substrate, the through semiconductor vias, and the bonding layer together configure a carrier structure. The second die structure and the first die structure are electrically coupled by the through semiconductor vias.

Due to the design of the semiconductor device of the present disclosure, heat accumulated during the operation of the semiconductor device may be thermally conducted to the ambient through the conductive plates and the through semiconductor vias. That is, the thermal conducting capability of the semiconductor device may be improved. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
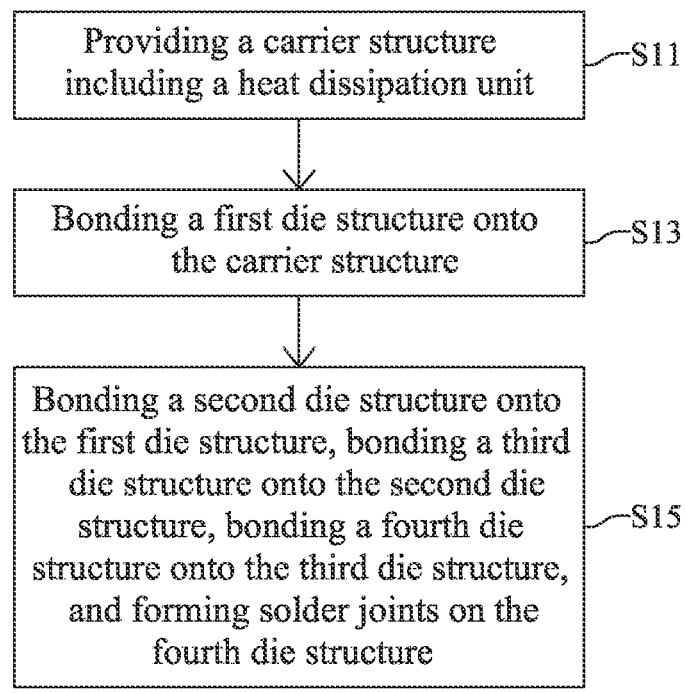
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

Figure 2:
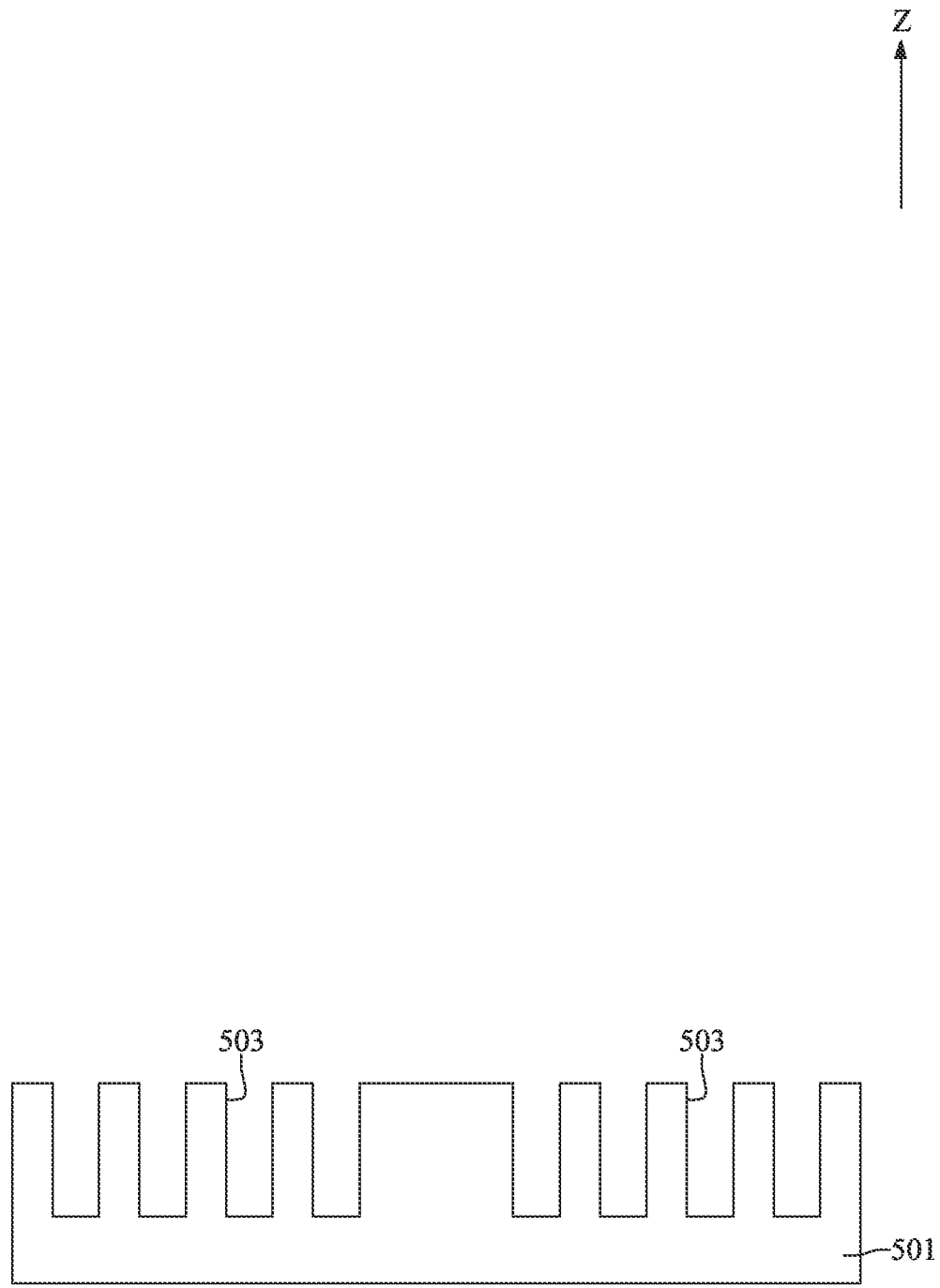
FIGS. 2 and 3 illustrate, in schematic cross-sectional view diagrams, part of a flow for fabricating the semiconductor device in accordance with one embodiment of the present disclosure.
Figure 3:
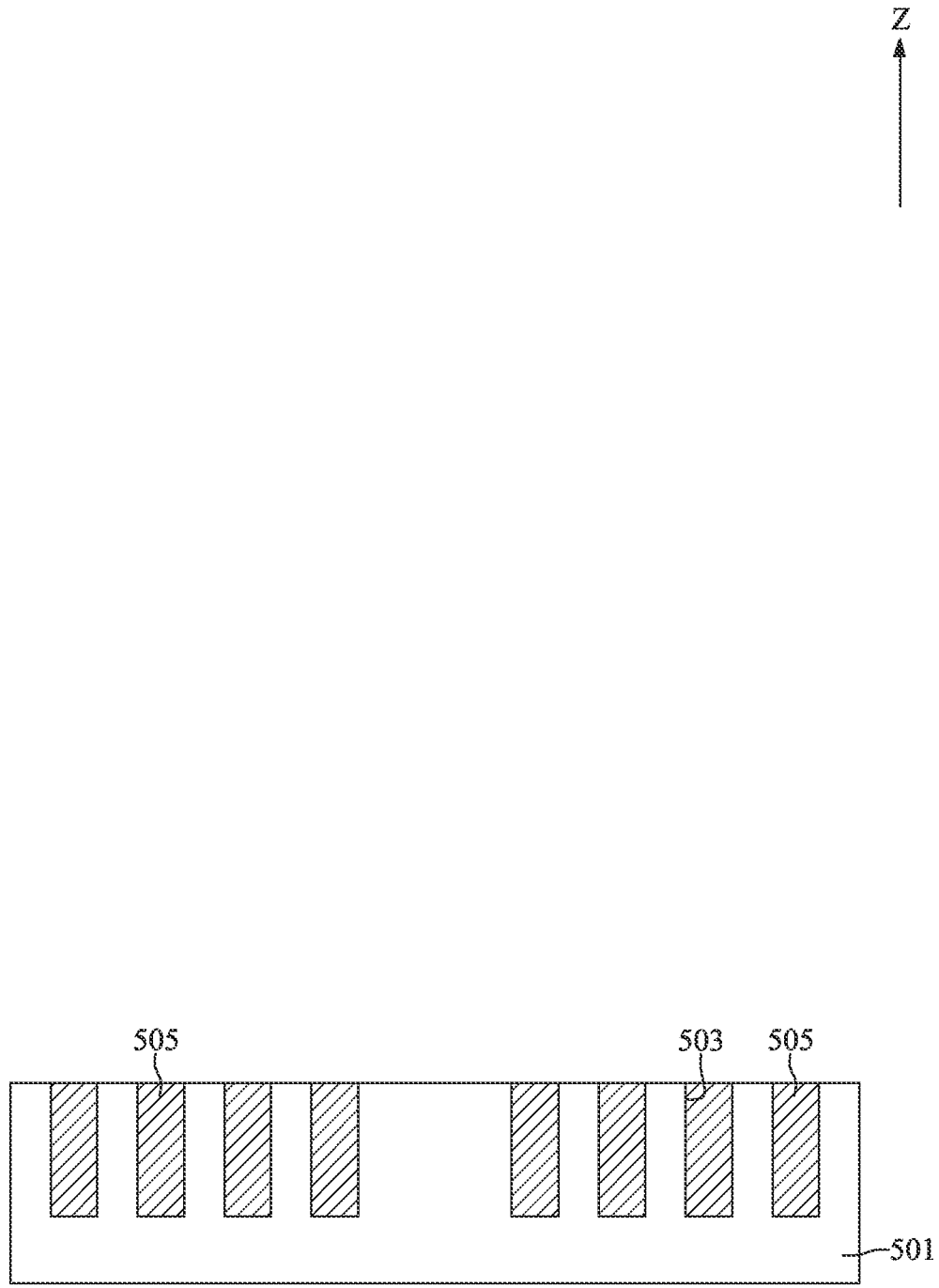
Figure 4:
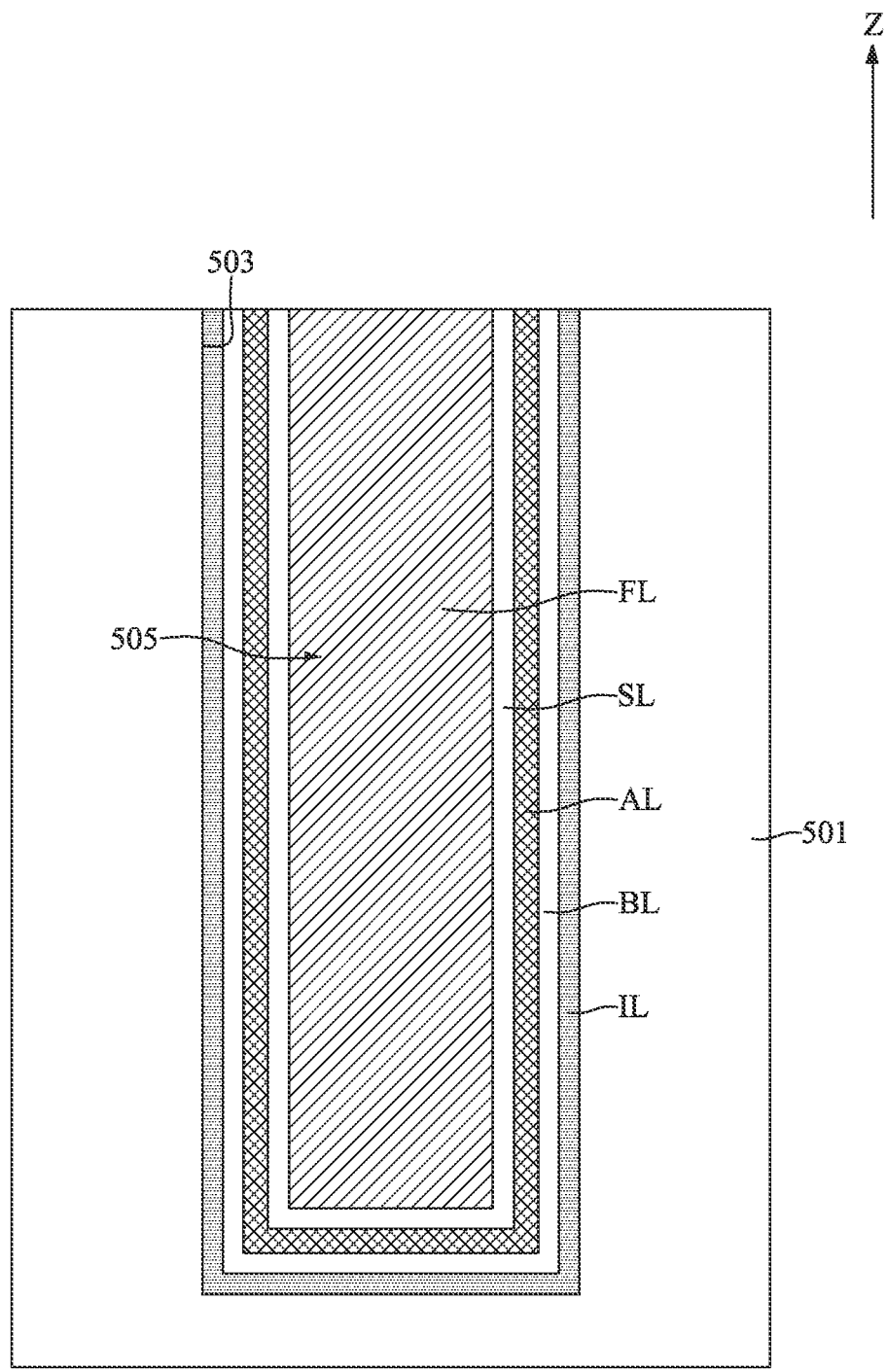
FIG. 4 illustrates, in a schematic close-up cross-sectional view diagram, an intermediate semiconductor device in accordance with one embodiment of the present disclosure.
Figure 5:
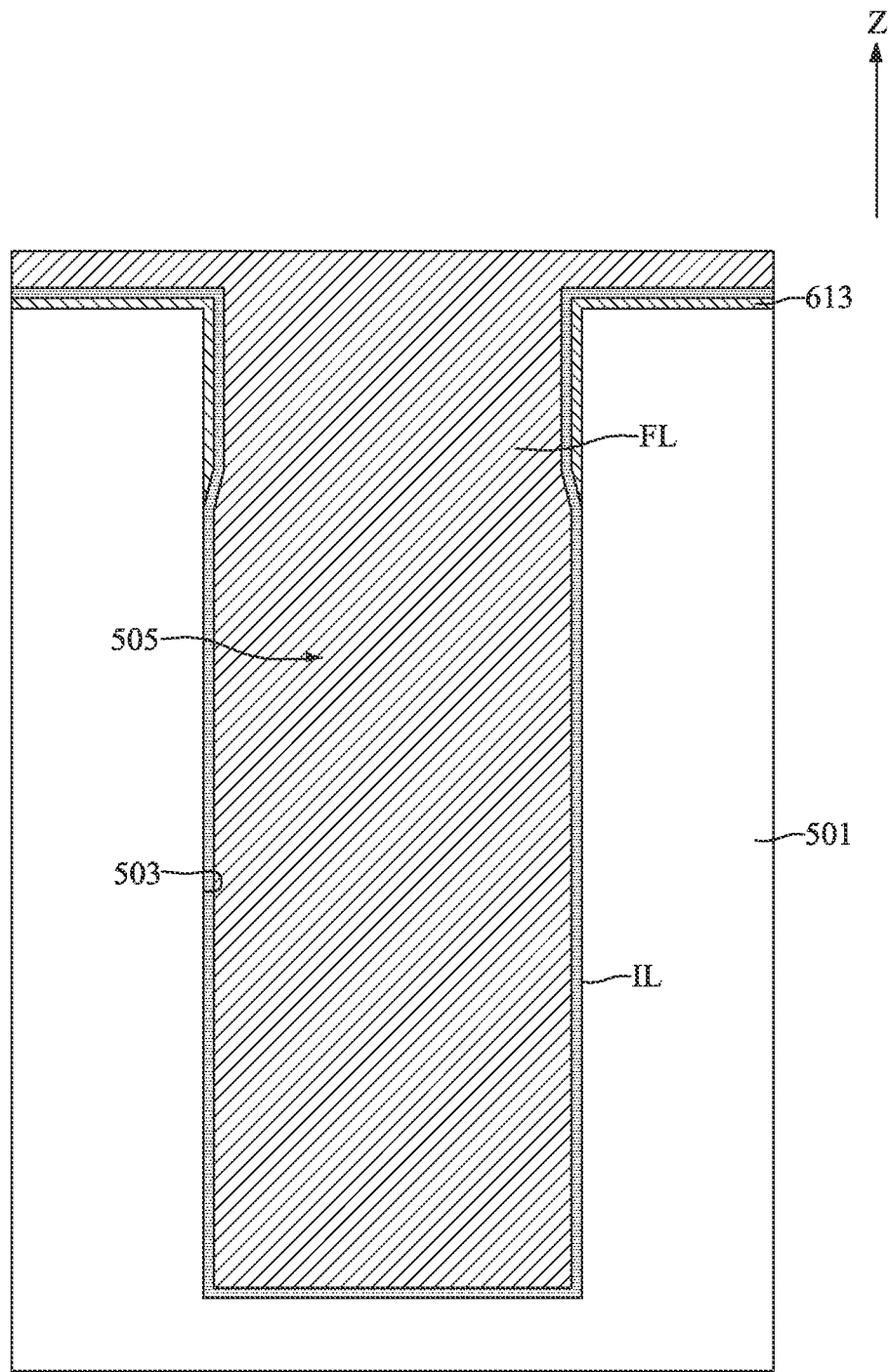
FIGS. 5 and 6 illustrate, in schematic close-up cross-sectional view diagrams, intermediate semiconductor devices in accordance with another embodiment of the present disclosure.
Figure 6:
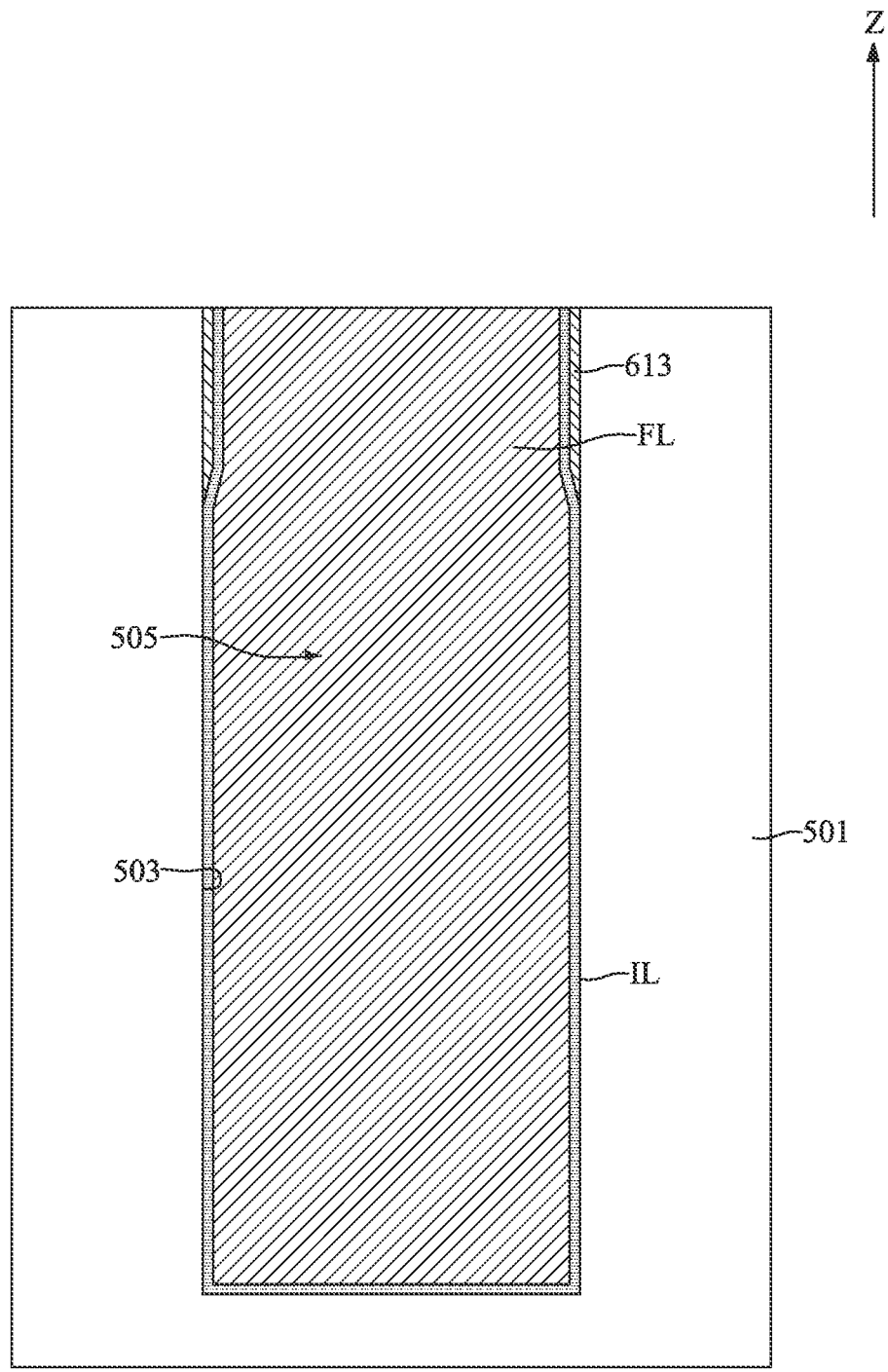

FIG. 1 illustrates, in a flowchart diagram form, a method 10 for fabricating a semiconductor device 1A in accordance with one embodiment of the present disclosure. FIGS. 2 and 3 illustrate, in schematic cross-sectional view diagrams, part of a flow for fabricating the semiconductor device 1A in accordance with one embodiment of the present disclosure. FIG. 4 illustrates, in a schematic close-up cross-sectional view diagram, an intermediate semiconductor device in accordance with one embodiment of the present disclosure. FIGS. 5 and 6 illustrate, in schematic close-up cross-sectional view diagrams, intermediate semiconductor devices in accordance with another embodiment of the present disclosure. FIGS. 7 to 15 illustrate, in schematic cross-sectional view diagrams, part of the flow for fabricating the semiconductor device 1A in accordance with one embodiment of the present disclosure.

With reference to FIGS. 1 to 8, at step S11, a carrier structure 500 including a heat dissipation unit HDU may be provided.

With reference to FIG. 2, a carrier substrate 501 may be provided and via openings 503 may be formed in the carrier substrate 501. The carrier substrate 501 may be formed of for example, silicon, germanium, silicon germanium, silicon carbon, silicon germanium carbon, gallium, gallium arsenide, indium arsenide, indium phosphorus or other IV-IV, III-V or II-VI semiconductor materials.

With reference to FIG. 2, the inner walls of the via openings 503 may be slightly tapered such as between about 85 degree to about 88 degree and smooth for conformal and void-free material filling as will be illustrated later. The tapered inner walls of the via openings 503 may be also improve diffusion of metal ions within the via openings 503 and may reduce the time for filling the via openings 503. In addition, the smooth inner walls of the via openings 503 may be beneficial to reduce stress concentrations. In some embodiments, the widths of the via openings 503 may be between about 1 μm and about 22 μm or between about 5 μm and about 15 μm. In some embodiments, the depths of the via openings 503 may be between about 20 μm and about 160 μm or between about 50 μm and about 130 μm.

The via openings 503 may be formed by, for example, laser drilling, powder blast micromachining, deep reactive ion etching, or wet etching using hydroxides such as potassium hydroxide, sodium hydroxide, rubidium hydroxide, ammonium hydroxide, or tetra methyl ammonium hydroxide.

With reference to FIG. 3, through semiconductor vias 505 may be formed to completely fill the via openings 503. Generally, the through semiconductor vias 505 may be formed by liner deposition and conductive material filling. A planarization process, such as chemical mechanical polishing, may be performed to provide a substantially flat surface for subsequent processing steps. In some embodiments, the sidewalls of the through semiconductor vias 505 may be slightly tapered such as between about 85 degree and about 88 degree. In some embodiments, the widths of the through semiconductor vias 505 may be between about 1 μm and about 22 μm or between about 5 μm and about 15 μm. In some embodiments, the depths of the through semiconductor vias 505 may be between about 20 μm and about 160 μm or between about 50 μm and about 130 μm.

For convenience of description, only one through semiconductor via 505 is described. With reference to FIG. 4, the through semiconductor via 505 may include a filler layer FL, a seed layer SL, an adhesion layer AL, a barrier layer BL, and an isolation layer IL. The isolation layer IL may be conformally formed in the via opening 503 and may have an U-shaped cross-sectional profile. In some embodiments, the isolation layer IL may be formed of, for example, silicon oxide, silicon nitride, silicon oxynitride, or tetra-ethyl orthosilicate. The isolation layer IL may have a thickness between about 50 nm and about 200 nm. Alternatively, in some embodiments, the isolation layer IL may be formed of, for example, parylene, epoxy, or poly(p-xylene). The isolation layer IL may have a thickness between about 1 μm and about 5 μm. The isolation layer 1L may ensure the filler layer FL is electrically isolated in the carrier substrate 501.

With reference to FIG. 4, the barrier layer BL may be conformally formed on the isolation layer IL and may have an U-shaped cross-sectional profile. The barrier layer BL may be formed of, for example, tantalum, tantalum nitride, titanium, titanium nitride, rhenium, nickel boride, or tantalum nitride/tantalum bilayer. The barrier layer BL may inhibit diffusion of the conductive materials of the filler layer FL into the isolation layer IL. The barrier layer BL may be formed by deposition process such as physical vapor deposition, atomic layer deposition, chemical vapor deposition, or sputtering.

With reference to FIG. 4, the adhesion layer AL may be conformally formed on the barrier layer BL and may have an U-shaped cross-sectional profile. The adhesion layer AL may be formed of, for example, titanium, tantalum, titanium tungsten, or manganese nitride. The adhesion layer AL may improve an adhesion between the seed layer SL and the barrier layer BL. The adhesion layer AL may have a thickness between about 5 nm and about 50 nm. The adhesion layer AL may be formed by deposition process such as physical vapor deposition, atomic layer deposition, chemical vapor deposition, or sputtering.

With reference to FIG. 4, the seed layer SL may be conformally formed on the adhesion layer AL and may have an U-shaped cross-sectional profile. The seed layer SL may have a thickness between about 10 nm and about 40 nm. The seed layer SL may be formed of, for example, copper or ruthenium. The seed layer SL may be formed by deposition process such as physical vapor deposition, atomic layer deposition, chemical vapor deposition, or sputtering. The seed layer SL may reduce resistivities of the via opening 503 during the formation of the filler layer FL by an electroplating process.

With reference to FIG. 4, the filler layer FL may be formed on the seed layer SL and completely fill the via opening 503. The filler layer FL may be, for example, copper. The filler layer FL may be formed by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C.

In some embodiments, the plating solution may include accelerators, suppressors, or levelers. The accelerators may include a polar sulfur, oxygen, or nitrogen functional group that help to increase deposition rates and may promote dense nucleation. The accelerators may be present at a low concentration level, for example, between about 0 and about 200 ppm. The suppressors are additives that reduce the plating rate and are usually present in the plating bath at higher concentrations, for example, between about 5 ppm and about 1000 ppm. The suppressors may be polymeric surfactants with high molecular weight, such as polyethylene glycol.

The suppressors may slow down the deposition rate by adsorbing on the surface and forming a barrier layer to the copper ions. Because of their large size and low diffusion rate, the suppressors are less likely to reach the lower part of the via opening 503. Therefore, most of suppressing effect may occur at the lower part of the via opening 503, helping to reduce overburden of the filling material (e.g., copper) and avoid the via opening 503 "closing".

The leveler may be used to improve filling performance, decrease the surface roughness, and prevent copper deposition at the upper part of the via opening 503. The levelers may be present in a small concentrations, for example, between about 1 ppm and about 100 ppm. The levelers may be, for example, 3-mercapto-1-propanesulfonate, (3-sulfopropyl) disulfide, or 3,3-thiobis (I-propanesulfonate).

It should be noted that, in the present disclosure, the term "part" or "segment" may be interchangeably used with the term "portion."

In some embodiments, an annealing process may be performed after the formation of the filler layer FL. The annealing process may reduce the adverse effects of copper-pumping during subsequent semiconductor processes, improve the adhesion between the filler layer FL and the isolation layer IL, and stabilize the microstructure of the filler layer FL.

Alternatively, with reference to FIG. 5, covering layers 613 may be conformally formed on the upper part of the via opening 503 and formed on the top surface of the carrier substrate 501. The isolation layer IL may be conformally formed on the covering layers 613 and in the via openings 503. The filler layer FL may be formed to completely fill the via openings 503. It should be noted that the barrier layer BL, the adhesion layer AL, and the seed layer SL are not shown in FIG. 5 for clarity.

The covering layers 613 may be formed by a deposition process such as an atomic layer deposition method precisely controlling an amount of a first precursor of the atomic layer deposition method. The covering layers 613 may be formed of, for example, aluminum oxide, hafnium oxide, zirconium oxide, titanium oxide, titanium nitride, tungsten nitride, silicon nitride, or silicon oxide.

In some embodiments, when the covering layers 613 are formed of aluminum oxide, the first precursor of the atomic layer deposition method may be trimethylaluminum and a second precursor of the atomic layer deposition method may be water or ozone.

In some embodiments, when the covering layers 613 are formed of hafnium oxide, the first precursor of the atomic layer deposition method may be hafnium tetrachloride, hafnium tert-butoxide, hafnium dimethylamide, hafnium ethylmethylamine, hafnium diethylamide, or hafnium methoxy-t-butoxide and the second precursor of the atomic layer deposition method may be water or ozone.

In some embodiments, when the covering layers 613 are formed of zirconium oxide, the first precursor of the atomic layer deposition method may be zirconium tetrachloride and the second precursor of the atomic layer deposition method may be water or ozone.

In some embodiments, when the covering layers 613 are formed of titanium oxide, the first precursor of the atomic layer deposition method may be titanium tetrachloride, tetraethyl titanate, or titanium isopropoxide and the second precursor of the atomic layer deposition method may be water or ozone.

In some embodiments, when the covering layers 613 are formed of titanium nitride, the first precursor of the atomic layer deposition method may be titanium tetrachloride and ammonia.

In some embodiments, when the covering layers 613 are formed of tungsten nitride, the first precursor of the atomic layer deposition method may be tungsten hexafluoride and ammonia.

In some embodiments, when the covering layers 613 are formed of silicon nitride, the first precursor of the atomic layer deposition method may be silylene, chlorine, ammonia, and/or dinitrogen tetrahydride.

In some embodiments, when the covering layers 613 are formed of silicon oxide, the first precursor of the atomic layer deposition method may be silicon tetraisocyanate or $CH_3OSi(NCO)_3$ and the second precursor of the atomic layer deposition method may be hydrogen or ozone.

Due to the presence of the covering layers 613, the deposition rate of the filling material of the filler layer FL on the sidewalls of the via opening 503 may be reduced. Hence, the deposition rate of the filling material of the filler layer FL on the sidewalls of the via opening 503 and the deposition rate of the filling material of the filler layer FL on the bottom surface of the via opening 503 may become close to each other. As a result, the via opening 503 may be filled without any void formation near the bottom surface of the via opening 503.

With reference to FIG. 6, a planarization process, such as chemical mechanical polishing, may be performed to remove excess material, provide a substantially flat surface for subsequent processing steps, and concurrently form the through semiconductor via 505.

Figure 7:
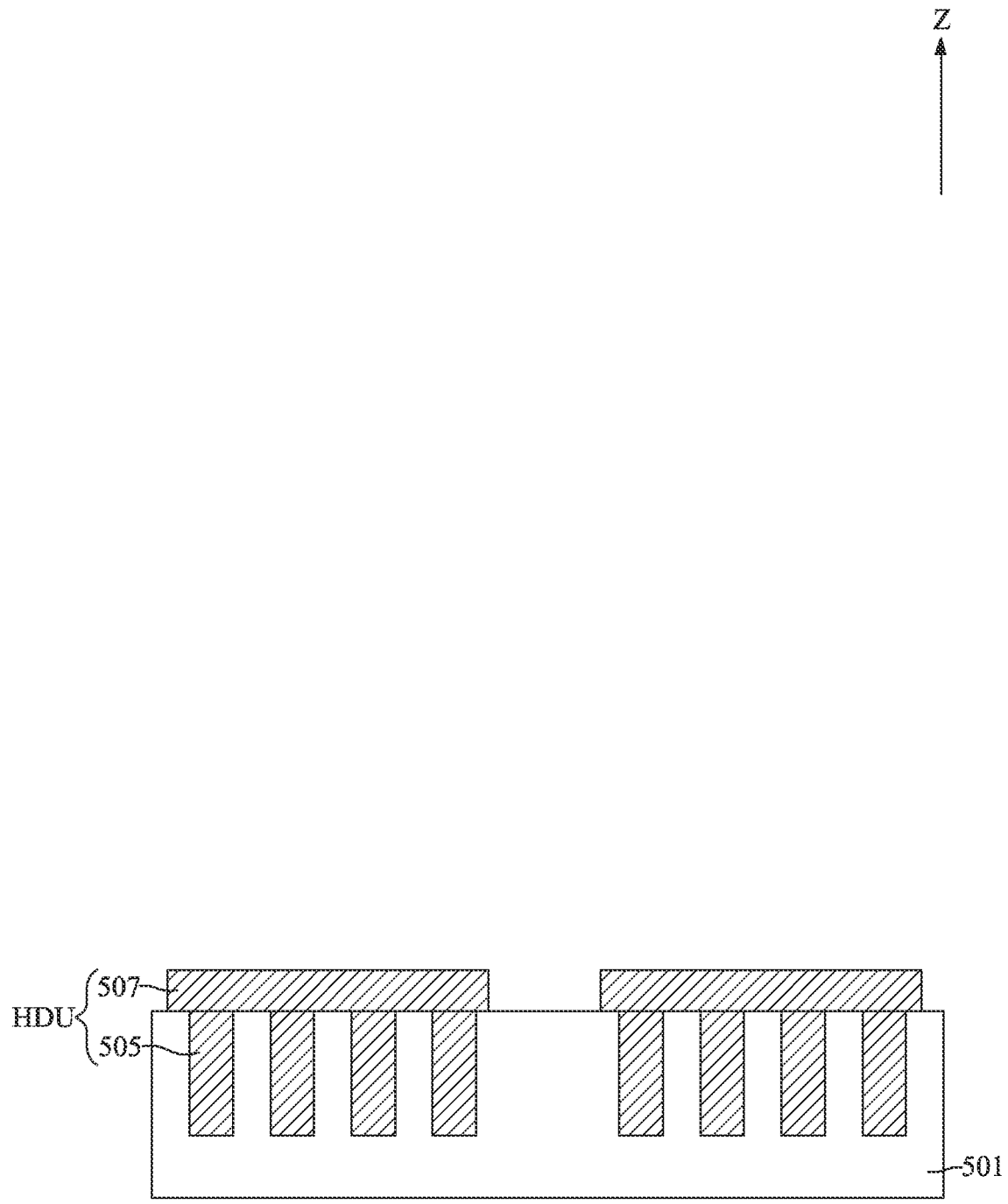
FIGS. 7 to 15 illustrate, in schematic cross-sectional view diagrams, part of the flow for fabricating the semiconductor device in accordance with one embodiment of the present disclosure.

With reference to FIG. 7, conductive plates 507 may be formed on the carrier substrate 501 and may be separated from each other. Each one of the conductive plates 507 may connect to two or more through semiconductor vias 505. The conductive plates 507 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The conductive plates 507 and the through semiconductor vias 505 together configure the heat dissipation unit HDU.

In some embodiments, only one conductive plate 507 may be formed on the carrier substrate 501 and may connect to all the through semiconductor vias 505.

Figure 8:
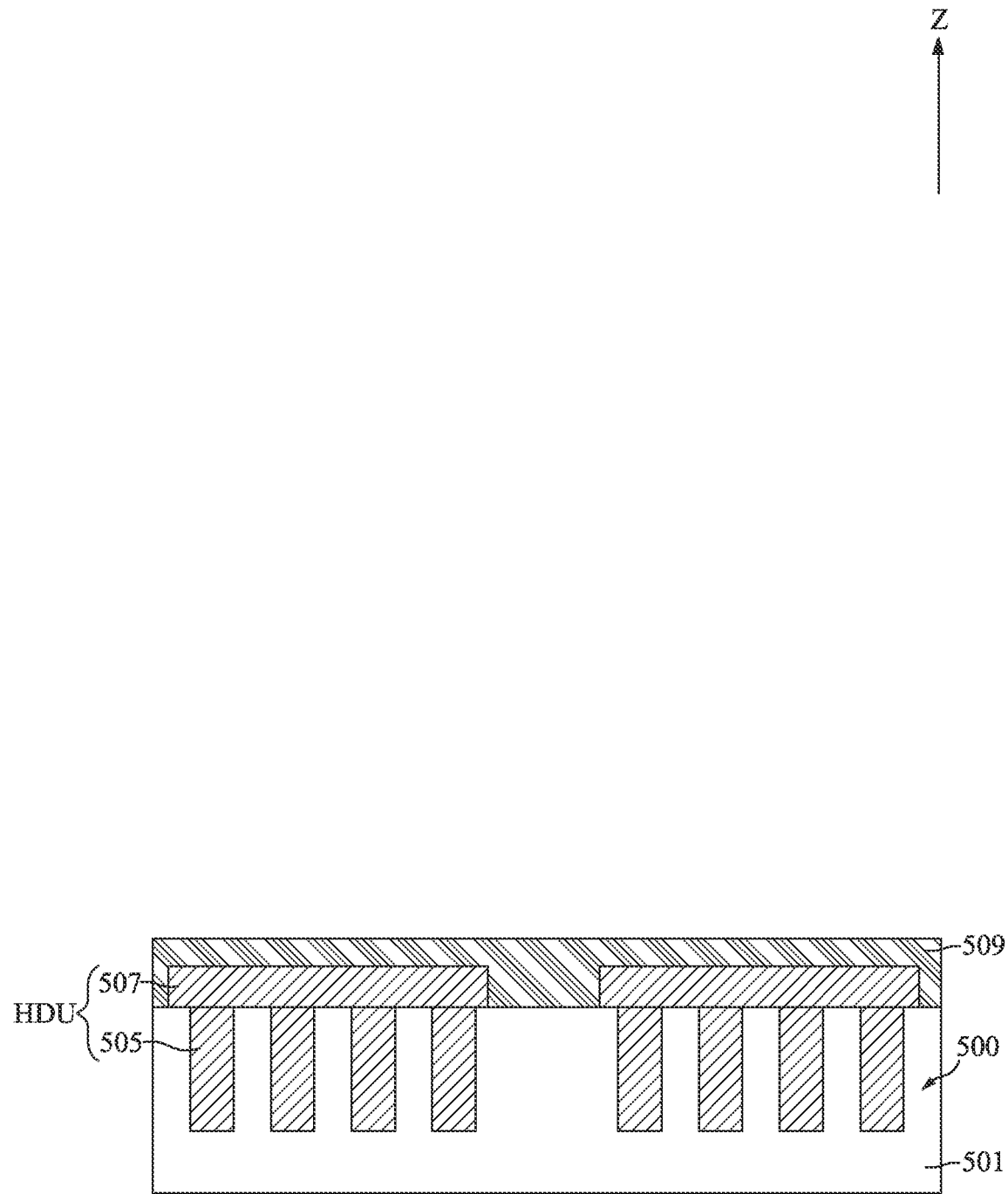

With reference to FIG. 8, a bonding layer 509 may be formed on the carrier substrate 501 and to cover the conductive plates 507. A planarization process, such as chemical mechanical polishing, may be performed to provide a substantially flat surface for subsequent processing steps. In some embodiments, the bonding layer 509 may be formed of for example, a non-organic material selected from un-doped silicate glass, silicon nitride, silicon oxynitride, silicon oxide, silicon nitride oxide, and combinations thereof. In some embodiments, the bonding layer 509 may be formed of, for example, a polymer layer such as an epoxy, polyimide, benzocyclobutene, polybenzoxazole, or the like. The bonding layer 509 may be formed by a deposition process such as chemical vapor deposition, plasma-enhanced chemical vapor deposition, evaporation, or spin-on coating.

With reference to FIG. 8, the carrier substrate 501, the heat dissipation unit HDU, and the bonding layer 509 together configure the carrier structure 500. The carrier structure 500 may be employed to bond with another die (or another wafer) to form an intermediate stack structure for further bonding procedure.

With reference to FIG. 1 and FIGS. 9 to 13, at step S13, a first die structure 100 may be bonded onto the carrier structure 500.

Figure 9:
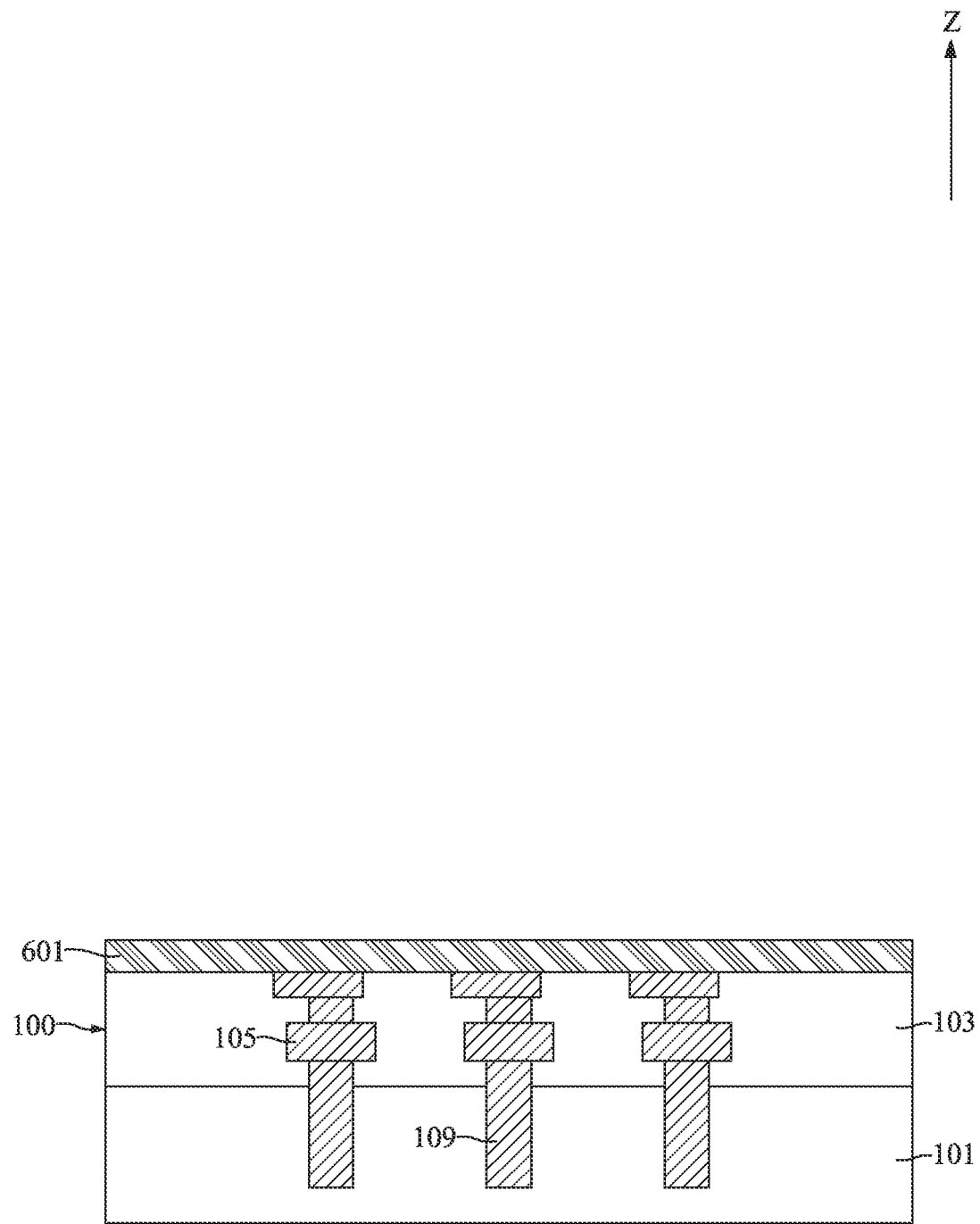

With reference to FIG. 9, a first substrate 101 may be provided. The first substrate 101 may be formed of a same material as the carrier substrate 501 but is not limited thereto. In some embodiments, the first substrate 101 may be formed of, for example, silicon, germanium, silicon germanium, silicon carbon, silicon germanium carbon, gallium, gallium arsenide, indium arsenide, indium phosphorus or other IV-IV, III-V or II-VI semiconductor materials. Through semiconductor vias 109 may be formed in the first substrate 101 and may be formed with a procedure similar to the through semiconductor vias 505 illustrated in FIGS. 2 to 6.

With reference to FIG. 9, a first dielectric layer 103 may be formed on the first substrate 101. In some embodiments, the first dielectric layer 103 may be a stacked layer structure. The first dielectric layer 103 may include a plurality of first insulating sub-layers. Each of the plurality of first insulating sub-layers may have a thickness between about 0.5 μm and about 3.0 μm. The plurality of first insulating sub-layers may be formed of, for example, silicon oxide, borophosphosilicate glass, undoped silicate glass, fluorinated silicate glass, low-k dielectric materials, the like, or a combination thereof. The plurality of first insulating sub-layers may be formed of different materials but are not limited thereto. The low-k dielectric materials may have a dielectric constant less than 3.0 or even less than 2.5. In some embodiments, the low-k dielectric materials may have a dielectric constant less than 2.0. The first dielectric layer 103 may be formed by deposition processes such as chemical vapor deposition, plasma-enhanced chemical vapor deposition, evaporation, or spin-on coating. Planarization processes may be respectively correspondingly performed after the deposition processes to remove excess material and provide a substantially flat surface for subsequent processing steps. Active elements and first interconnection layers 105 may be formed during the formation of the first dielectric layer 103.

The active elements (not shown) may be, for example, bipolar junction transistors, metal-oxide-semiconductor field-effect transistors, diodes, flash memories, dynamic random-access memories, static random-access memories, electrically erasable programmable read-only memories, image sensors, micro-electro-mechanical systems, active devices, or passive devices. The active elements and the through semiconductor vias 109 may be electrically coupled.

With reference to FIG. 9, the first interconnection layers 105 may be formed in the first dielectric layer 103. Each of the first interconnection layers 105 may include conductive lines, conductive vias, conductive contacts, or landing pads. The first interconnection layers 105 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The first interconnection layers 105 and the active elements may be electrically coupled.

With reference to FIG. 9, an intervening bonding layer 601 may be formed on the first dielectric layer 103. The intervening bonding layer 601 may be formed of a same material as the bonding layer 509 but is not limited thereto. In some embodiments, the intervening bonding layer 601 may be formed of, for example, a non-organic material selected from un-doped silicate glass, silicon nitride, silicon oxynitride, silicon oxide, silicon nitride oxide, and combinations thereof. In some embodiments, the intervening bonding layer 601 may be formed of, for example, a polymer layer such as an epoxy, polyimide, benzocyclobutene, polybenzoxazole, or the like. The intervening bonding layer 601 may be formed by a deposition process such as chemical vapor deposition, plasma-enhanced chemical vapor deposition, evaporation, or spin-on coating.

Figure 10:
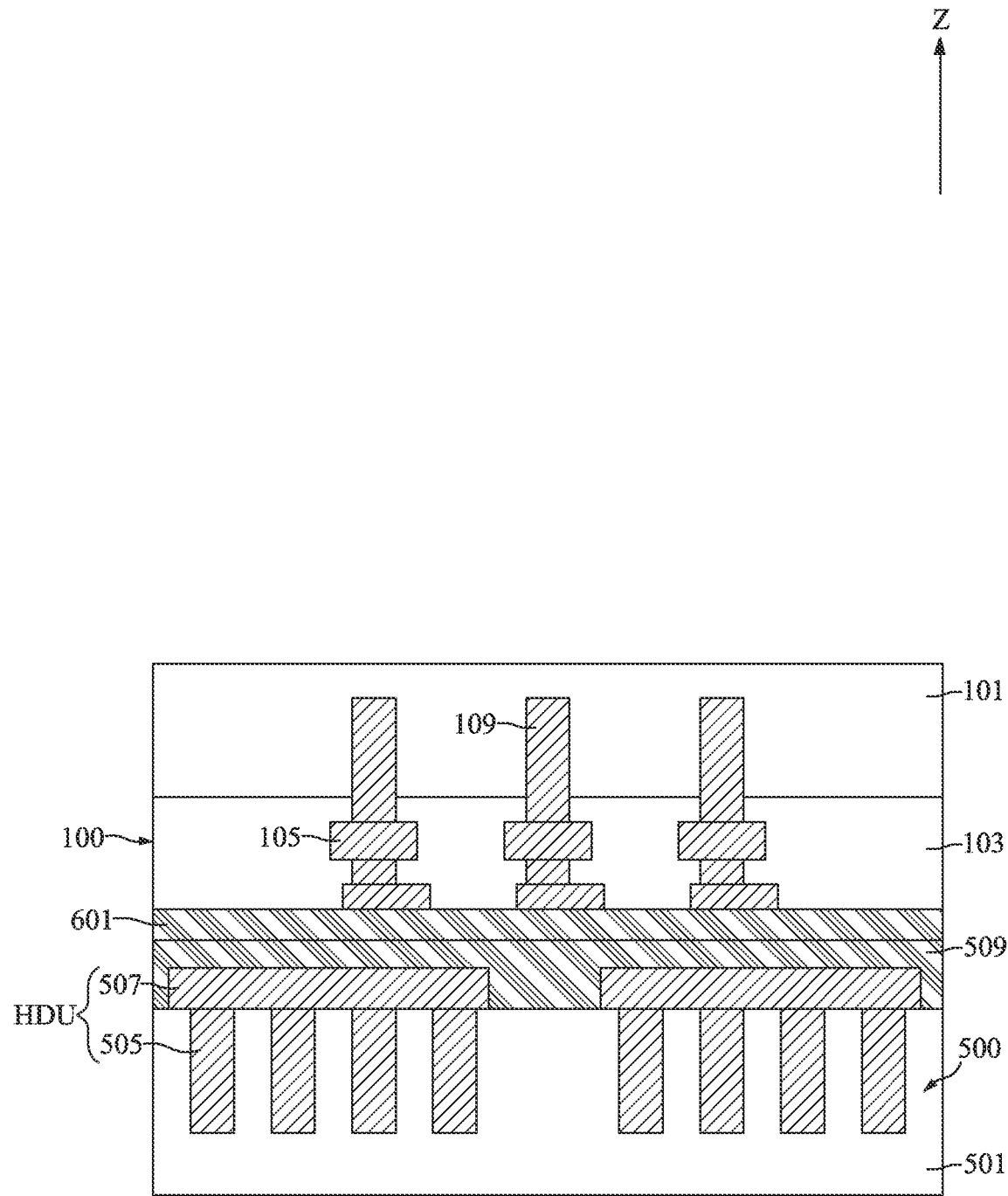

With reference to FIG. 10, the intermediate semiconductor device illustrated in FIG. 9 may be placed inverted and bonded onto the carrier substrate 501. Specifically, the intervening bonding layer 601 may be bonded onto the bonding layer 509 of the carrier structure 500. After bonding, the first dielectric layer 103 may be disposed on the intervening bonding layer 601 and the first substrate 101 may be disposed on the first dielectric layer 103. It should be noted that no electrical connection is established between the first interconnection layers 105 and the heat dissipation unit HDU.

In some embodiments, when the bonding layer 509 and the intervening bonding layer 601 are formed of for example, silicon oxide or silicon nitride, the bonding between the bonding layer 509 and the intervening bonding layer 601 may be based on the hydrophilic bonding mechanism. Hydrophilic surface modifications may be applied to the bonding layer 509 and the intervening bonding layer 601 before bonding. In some embodiments, when the bonding layer 509 and the intervening bonding layer 601 are formed of polymer adhesives such as polyimide, benzocyclobutenes, and polybenzoxazole, the bonding may be based on thermo-compression bonding.

Figure 11:
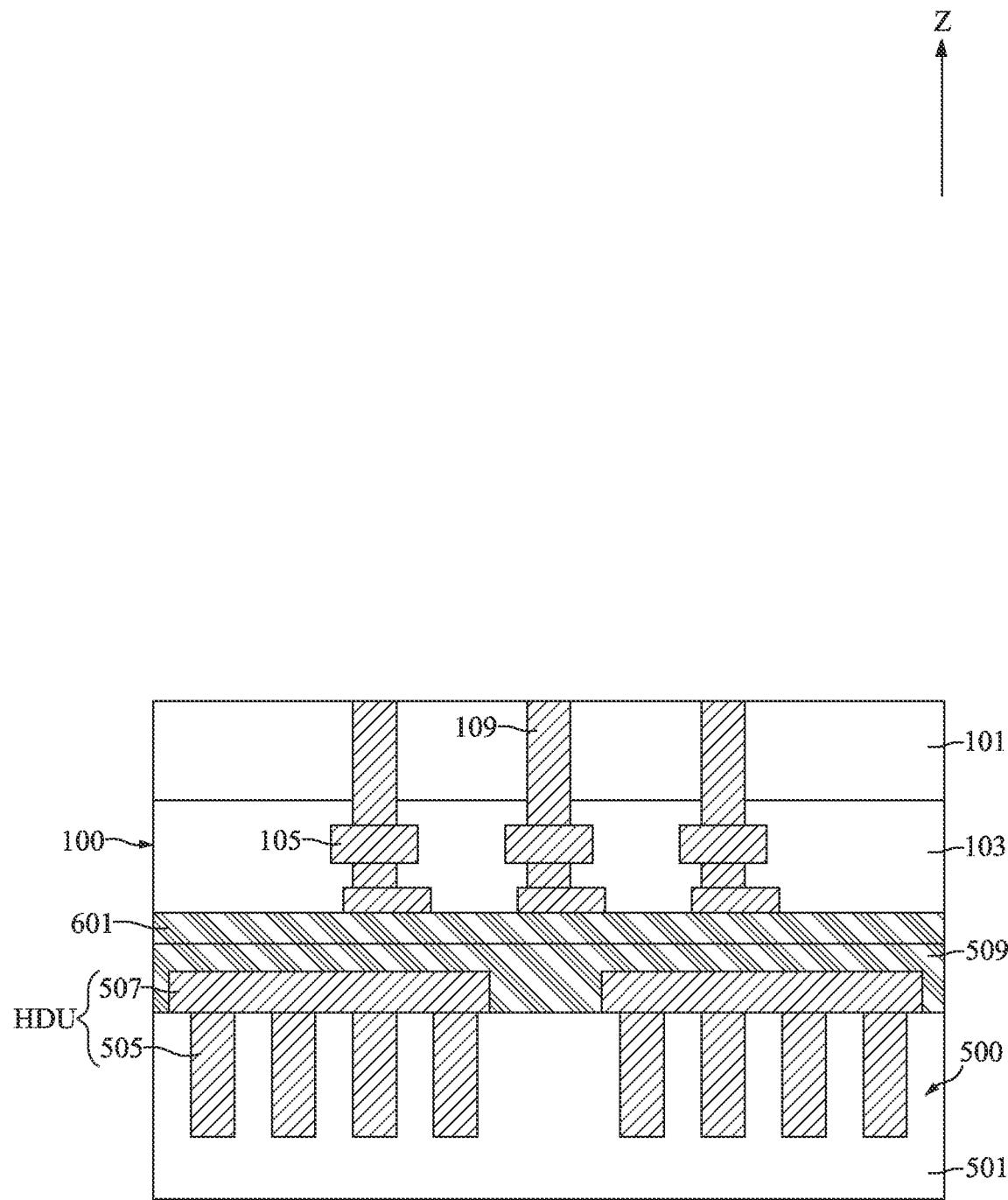

With reference to FIG. 11, a planarization process, such as chemical mechanical polishing, may be performed to expose the top surface of the through semiconductor vias 109.

Figure 12:
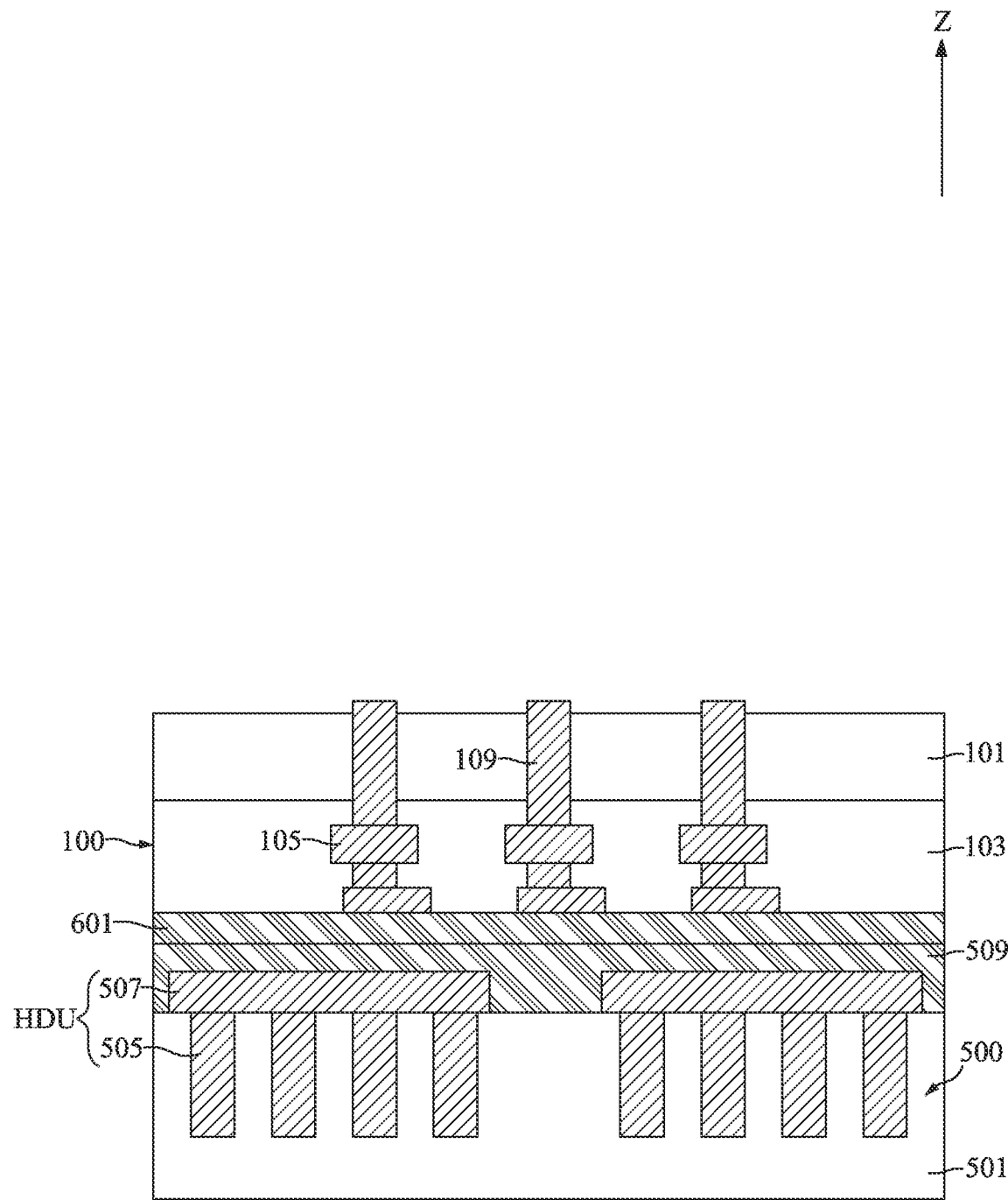

With reference to FIG. 12, an etch process may be performed to recess the top surface of the first substrate 101. The etch rate ratio of the first substrate 101 to the through semiconductor vias 109 may be between about 100:1 and about 1.05:1, between about 15:1 and about 2:1, or between about 10:1 and about 2:1 during the etch process. The top portions of the through semiconductor vias 109 may be protruded from the top surface of the first substrate 101 after the etch process.

Figure 13:
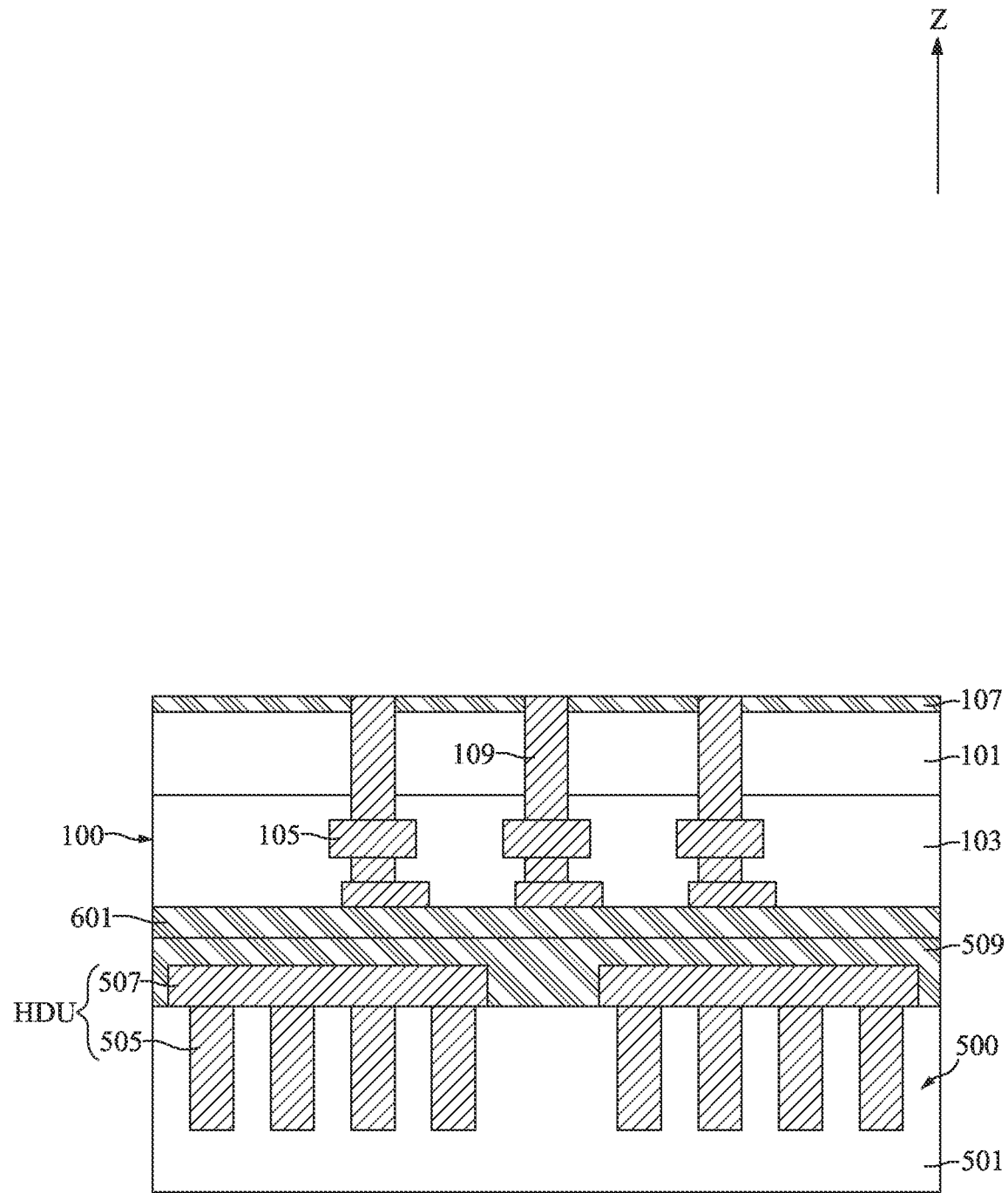

With reference to FIG. 13, a first bonding layer 107 may be formed on the first substrate 101. The first bonding layer 107 may be formed of a same material as the intervening bonding layer 601 but is not limited thereto. In some embodiments, the first bonding layer 107 may be formed of for example, a non-organic material selected from un-doped silicate glass, silicon nitride, silicon oxynitride, silicon oxide, silicon nitride oxide, and combinations thereof. In some embodiments, the first bonding layer 107 may be formed of for example, a polymer layer such as an epoxy, polyimide, benzocyclobutene, polybenzoxazole, or the like. The first bonding layer 107 may be formed by a deposition process such as chemical vapor deposition, plasma-enhanced chemical vapor deposition, evaporation, or spin-on coating. A planarization process, such as chemical mechanical polishing, may be performed to remove portions of the first bonding layer 107 and to expose the top surface of the through semiconductor vias 109.

With reference to FIG. 13, the first substrate 101, the first dielectric layer 103, the first interconnection layers 105, the first bonding layer 107, and the through semiconductor vias 109 together configure the first die structure 100. The exposed through semiconductor vias 109 may be used for further bonding with and electrically connecting to another die structure.

Figure 14:
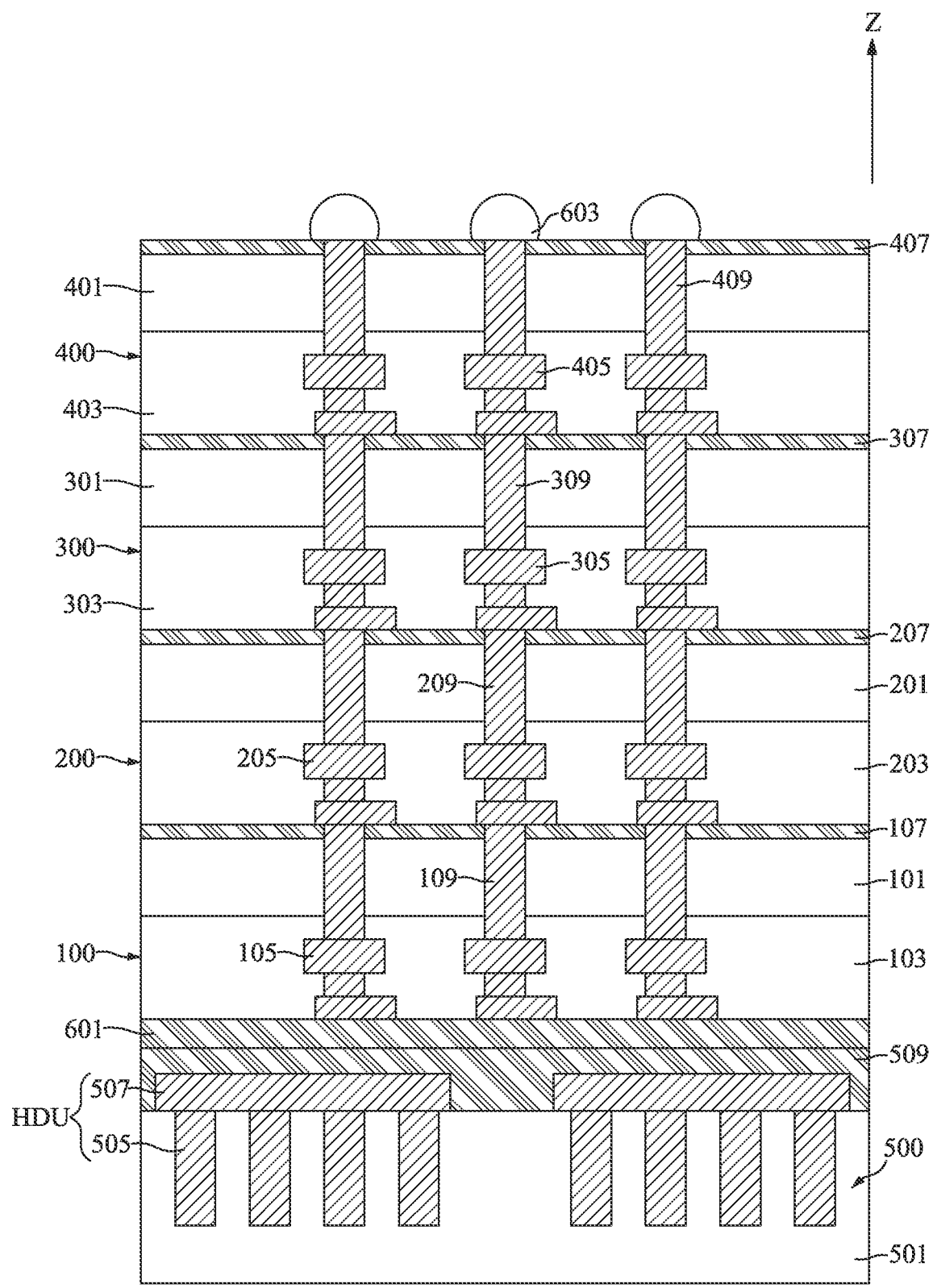
Figure 15:
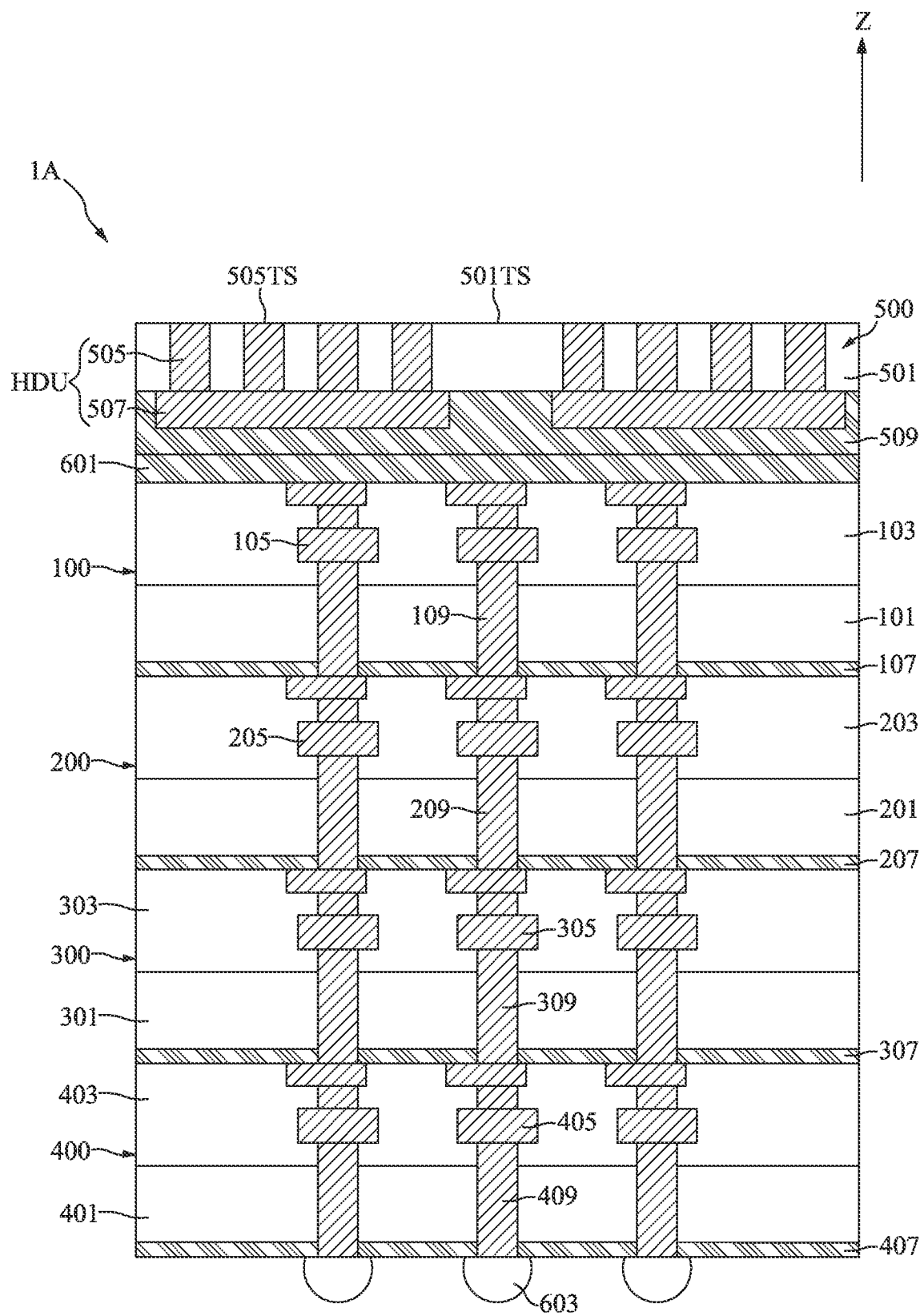

With reference to FIGS. 1, 14, and 15, at step S15, a second die structure 200 may be bonded onto the first die structure 100, a third die structure 300 may be bonded onto the second die structure 200, a fourth die structure 400 may be bonded onto the third die structure 300, and solder joints 603 may be formed on the fourth die structure 400.

With reference to FIG. 14, in some embodiments, the second die structure 200, the third die structure 300, and the fourth die structure 400 may have structures similar to the first die structure 100. For example, the second die structure 200 may also include a second substrate 201, a second dielectric layer 203, second interconnection layers 205, a first bonding layer 207, and through semiconductor vias 209. Elements of the second die structure 200, the third die structure 300, and the fourth die structure 400 with similar reference number to the first die structure 100 may have a same or similar configuration and may be formed of a same or similar material. The second die structure 200, the third die structure 300, and the fourth die structure 400 may be formed with a procedure similar to the first die structure 100 illustrated in FIGS. 9 to 13.

With reference to FIG. 14, the second die structure 200 may be bonded onto the first die structure 100 and may be electrically coupled to the first die structure 100 through the through semiconductor vias 109 of the first die structure 100. The third die structure 300 may be bonded onto the second die structure 200 and may be electrically coupled to the second die structure 200 through the through semiconductor vias 209 of the second die structure 200. The fourth die structure 400 may be bonded onto the third die structure 300 and may be electrically coupled to the third die structure 300 through the through semiconductor vias 309 of third die structure 300 of the through semiconductor vias 309 of third die structure 300.

The through semiconductor vias 109, 209, 309, 409 may decrease interconnection length between the die structures 100, 200, 300, 400. As a result, reflection noise, crosstalk noise, simultaneous switching noise, electromagnetic interference, and latency of the semiconductor device 1A may be reduced. Additionally, as the parasitic capacitance is proportional to the interconnection length, the total power consumption in the semiconductor device 1A may be also reduced because of the reduced parasitic capacitance.

The bonding between die structures 100, 200, 300, 400 may be hybrid bonding including, for example, dielectric-to-dielectric bonding, metal-to-metal bonding, or metal-to-dielectric bonding or metal-to-adhesive bonding. The dielectric-to-dielectric bonding may originate from the bonding between the bonding layer and the dielectric layer. The metal-to-metal bonding may originate from the bonding between the through semiconductor vias and the interconnection layers. The metal-to-dielectric bonding or metal-to-adhesive bonding may originate from the bonding between the interconnection layers and the bonding layer.

In some embodiments, the bonding methods for bonding the die structures 100, 200, 300, 400 may include, for example, thermo-compression bonding, passivation-capping-layer assisted bonding, or surface activated bonding. The process pressure of the bonding methods may be between about 100 MPa and about 150 MPa. The process temperature of the bonding methods may be between about room temperature and about 400° C. In some embodiments, surface treatments such as wet chemical cleaning and gas/vapor-phase thermal treatments may be used to lower the process temperature of the bonding methods or to short the time consuming of the bonding method. In some embodiments, an annealing process may be performed after the bonding of the die structures 100, 200, 300, 400 to enhance dielectric-to-dielectric bonding and to induce thermal expansion of metal-to-metal bonding so as to further improve the bonding quality.

The first die structure 100, the second die structure 200, the third die structure 300, and the fourth die structure 400 may together configure a die stack. In some embodiments, the first die structure 100, the second die structure 200, the third die structure 300, and the fourth die structure 400 may be all memory dies. In some embodiments, the first die structure 100 may be a logic die and the second die structure 200, the third die structure 300, and the fourth die structure 400 may be memory dies. It should be noted that the number of die structures is just for illustrative. The number of die structures may be greater than or less than four. For example, the number of die structures may be two (i.e., first die structure and second die structure). For example, the number of die structures may be five (i.e., first die structure to fifth die structure).

With reference to FIG. 14, the solder joints 603 may be formed on the first bonding layer 407 of fourth die structure 400 and may be electrically coupled to the through semiconductor vias 409 of fourth die structure 400. The solder joints 603 may comprise a material such as tin, or other suitable materials, such as silver or copper. In an embodiment in which the solder joints 603 are tin solder joints, the solder joints 603 may be formed by initially forming a layer of tin through evaporation, electroplating, printing, solder transfer, or ball placement to a thickness of about 10 μm to about 100 μm. Once the layer of tin has been formed on the first bonding layer 407 of fourth die structure 400, a reflow process may be performed to shape the solder joints 603 into the desired shape.

With reference to FIG. 15, the intermediate semiconductor device illustrated in FIG. 14 may be placed up-side down. A thinning process may be performed to reduce the thickness of the carrier substrate 501 and the thickness of the through semiconductor vias 505. The thinning process may be an etching process, a chemical polishing process, or a grinding process. After the thinning process, the top surfaces of the through semiconductor vias 505 may be exposed. The top surfaces 505TS of the through semiconductor vias 505 may be substantially coplanar with the top surface 501TS of the carrier substrate 501. The exposed top surfaces of the through semiconductor vias 505 may be beneficial to thermal conduction.

Conventionally, a carrier structure may be detached from a die structure after the bonding between die structures. In contrast, in the embodiments of the present disclosure, the carrier structure 500 may bond to the first die structure 100 after the bonding between the die structures 100, 200, 300, 400. In addition, with the presence of the heat dissipation unit HDU, heat accumulated during the operation of the semiconductor device 1A may be thermally conducted to the ambient through the conductive plates 507 and the through semiconductor vias 505. That is, the thermal conducting capability of the semiconductor device 1A may be improved.

FIGS. 16 to 20 illustrate, in schematic cross-sectional view diagrams, semiconductor devices 1B, 1C, 1D, 1E, and 1F in accordance with some embodiments of the present disclosure.

Figure 16:
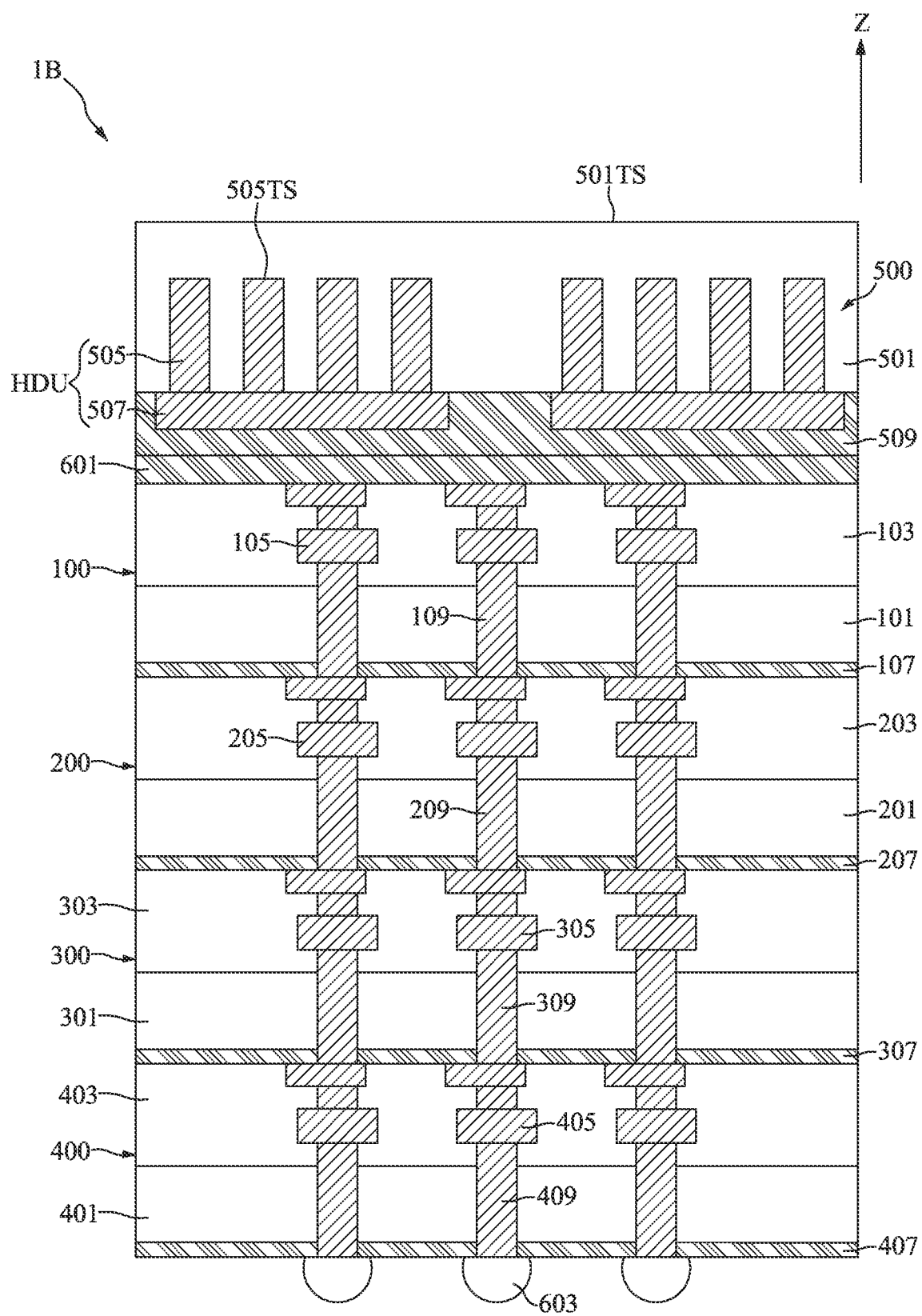
FIGS. 16 to 20 illustrate, in schematic cross-sectional view diagrams, semiconductor devices in accordance with some embodiments of the present disclosure.

With reference to FIG. 16, the semiconductor device 1B may have a structure similar to that illustrated in FIG. 15. The same or similar elements in FIG. 16 as in FIG. 15 have been marked with similar reference numbers and duplicative descriptions have been omitted. The thickness of the carrier substrate 501 may be reduced to a vertical level above the top surface 505TS of the through semiconductor vias 505. The top surface 501 of the carrier substrate 501 may be at a vertical level above a vertical level of the top surface 505TS of the through semiconductor vias 505. That is, the through semiconductor vias 505 may be remained covered by the carrier substrate 501. The covered through semiconductor vias 505 may prevented the through semiconductor vias 505 from oxidation.

Figure 17:
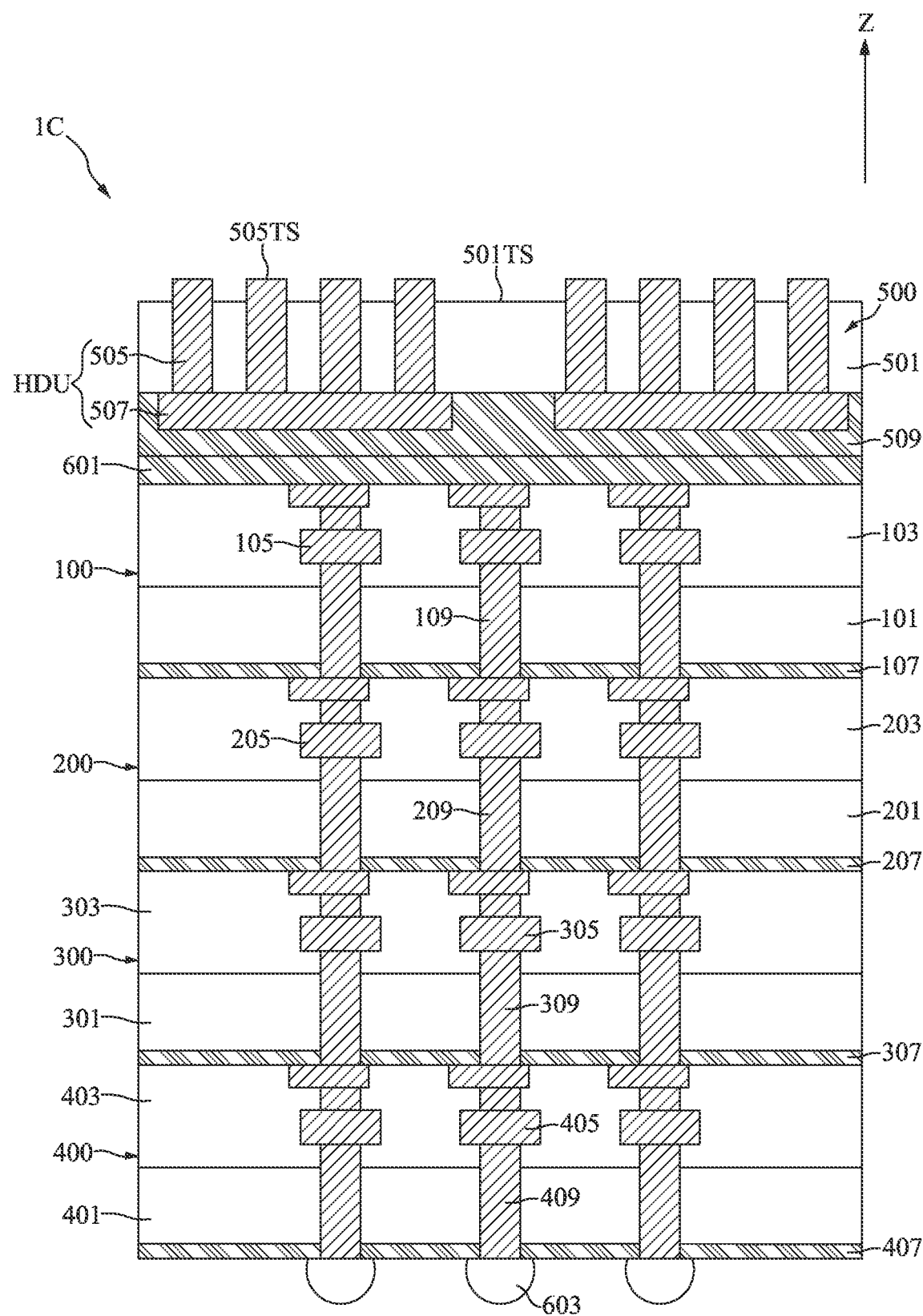

With reference to FIG. 17, the semiconductor device 1C may have a structure similar to that illustrated in FIG. 15. The same or similar elements in FIG. 17 as in FIG. 15 have been marked with similar reference numbers and duplicative descriptions have been omitted. The thickness of the carrier substrate 501 may be reduced by an etch process and may be reduced to a vertical level lower than the top surface 505TS of the through semiconductor vias 505. As a result, the upper portions of the through semiconductor vias 505 may be protruded from the top surface 501TS of the carrier substrate 501. The exposed portions of the through semiconductor vias 505 may have greater surface area to contact with ambient. Therefore, the thermal conducting efficiency of the through semiconductor vias 505 may be increased.

Figure 18:
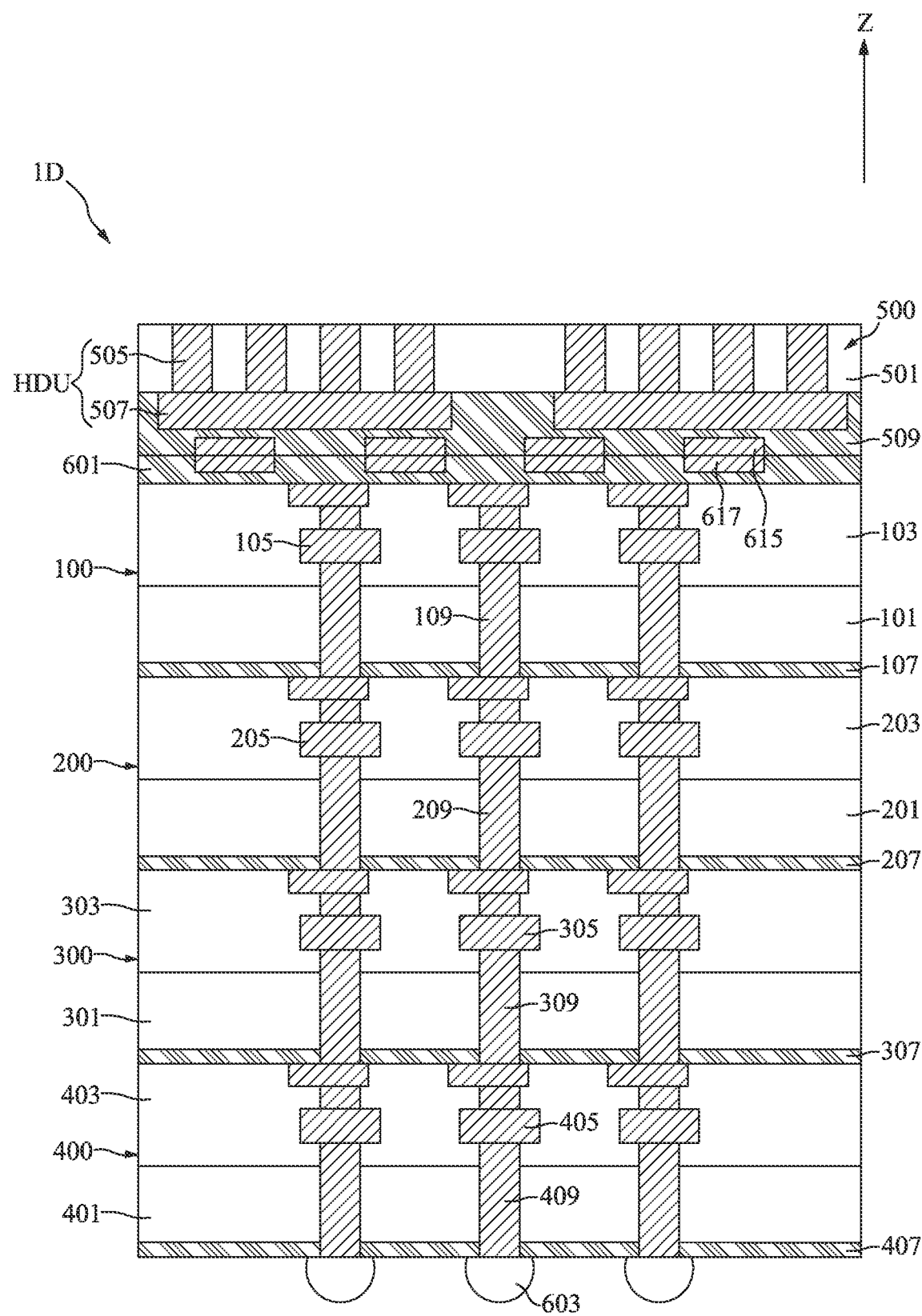

With reference to FIG. 18, the semiconductor device 1D may have a structure similar to that illustrated in FIG. 15. The same or similar elements in FIG. 18 as in FIG. 15 have been marked with similar reference numbers and duplicative descriptions have been omitted.

The semiconductor device 1D may include first dummy conductive layers 615 and second dummy conductive layers 617. The first dummy conductive layers 615 may be disposed in the bonding layer 509 and may be substantially coplanar with the interface between the bonding layer 509 and the intervening bonding layer 601. The second dummy conductive layers 617 may be disposed in the intervening bonding layer 601 and may be substantially coplanar with the interface between the bonding layer 509 and the intervening bonding layer 601. The first dummy conductive layers 615 may be vertically aligned with the second dummy conductive layers 617 and may contact the second dummy conductive layers 617. The first dummy conductive layers 615 and the second dummy conductive layers 617 may be formed of, for example, tungsten, cobalt, zirconium, tantalum, titanium, aluminum, ruthenium, or copper. The first dummy conductive layers 615 and the second dummy conductive layers 617 may improve the bonding quality between the bonding layer 509 and the intervening bonding layer 601 by providing metal-to-metal bonding.

It should be noted that referring to an element as a "dummy" element means that no exterior voltage or current is applied to the element when the semiconductor device is in operation.

Figure 19:
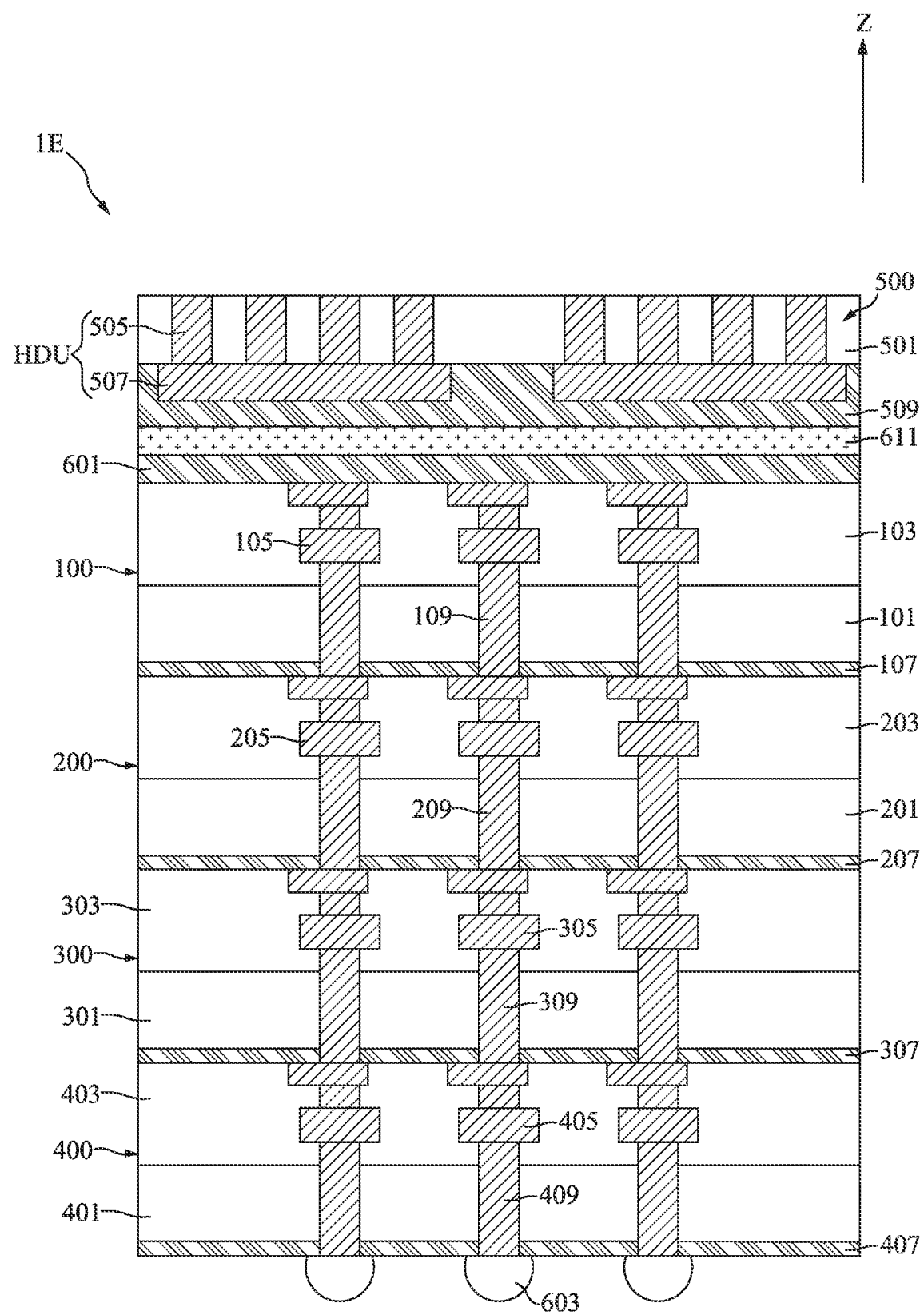

With reference to FIG. 19, the semiconductor device 1E may have a structure similar to that illustrated in FIG. 15. The same or similar elements in FIG. 19 as in FIG. 15 have been marked with similar reference numbers and duplicative descriptions have been omitted.

The semiconductor device 1E may include a thermal interface layer 611 disposed between the intervening bonding layer 601 and the bonding layer 509. In some embodiments, the thermal interface layer 611 may be formed of a carbon material that is imbued with a flexible material such as a polymer matrix. For example, the thermal interface layer 611 may include generally vertically oriented graphite and carbon nanotubes, which are imbued with a fluoropolymer rubber matrix. The aspect ratio of the carbon nanotubes may be between about 1:1 and about 1:100. For another example, the thermal interface layer 611 may include graphitic carbon. For yet another example, the thermal interface layer 611 may include pyrolytic graphite sheet. In some embodiments, a thermal resistance of the thermal interface layer 611 may be less than $0.2°$ C. $cm^2$/Watt at a thickness between about 250 μm and about 450 μm. The thermal interface layer 611 may provide additional thermal dissipation capability to the semiconductor device 1E.

Figure 20:
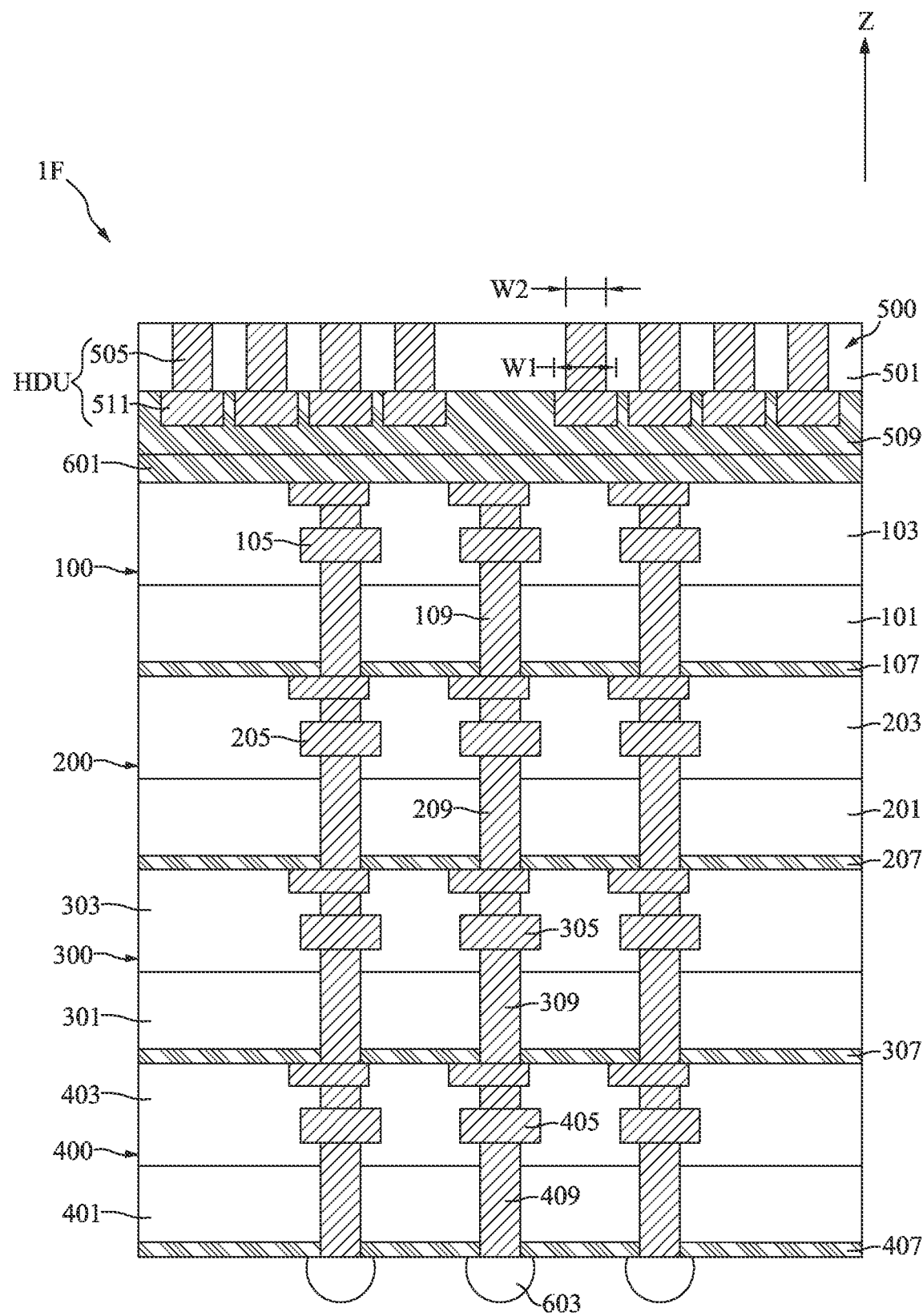

With reference to FIG. 20, the semiconductor device 1F may have a structure similar to that illustrated in FIG. 15. The same or similar elements in FIG. 20 as in FIG. 15 have been marked with similar reference numbers and duplicative descriptions have been omitted.

The semiconductor device 1F may include conductive fins 511 instead of the conductive plates 507 (as shown in FIG. 15). The conductive fins 511 may be disposed in the bonding layer 509 and may be separated from each other. Each of the conductive fins 511 may contact the corresponding one of the through semiconductor vias 505. The widths W1 of the conductive fins 511 may be greater than the widths W2 of the through semiconductor vias 505. As the total surface area of the conductive fins 511 may be greater than the total surface area of the conductive plates 507, the conductive fins 511 may provide additional heat dissipation capability to the semiconductor device 1F.

Figure 21:
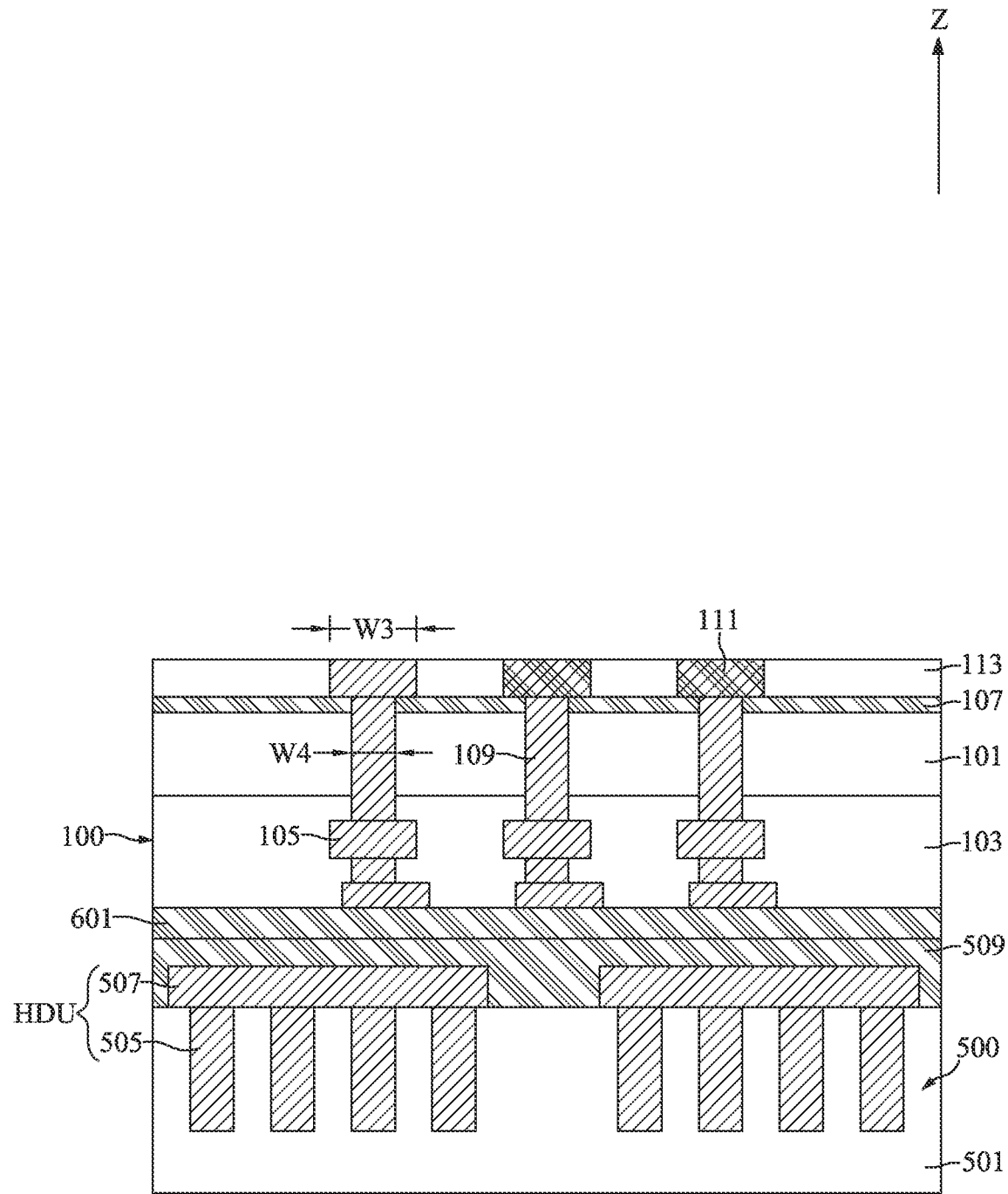
FIGS. 21 and 22 illustrate, in schematic cross-sectional view diagrams, a flow for fabricating a semiconductor device in accordance with another embodiment of the present disclosure.
Figure 22:
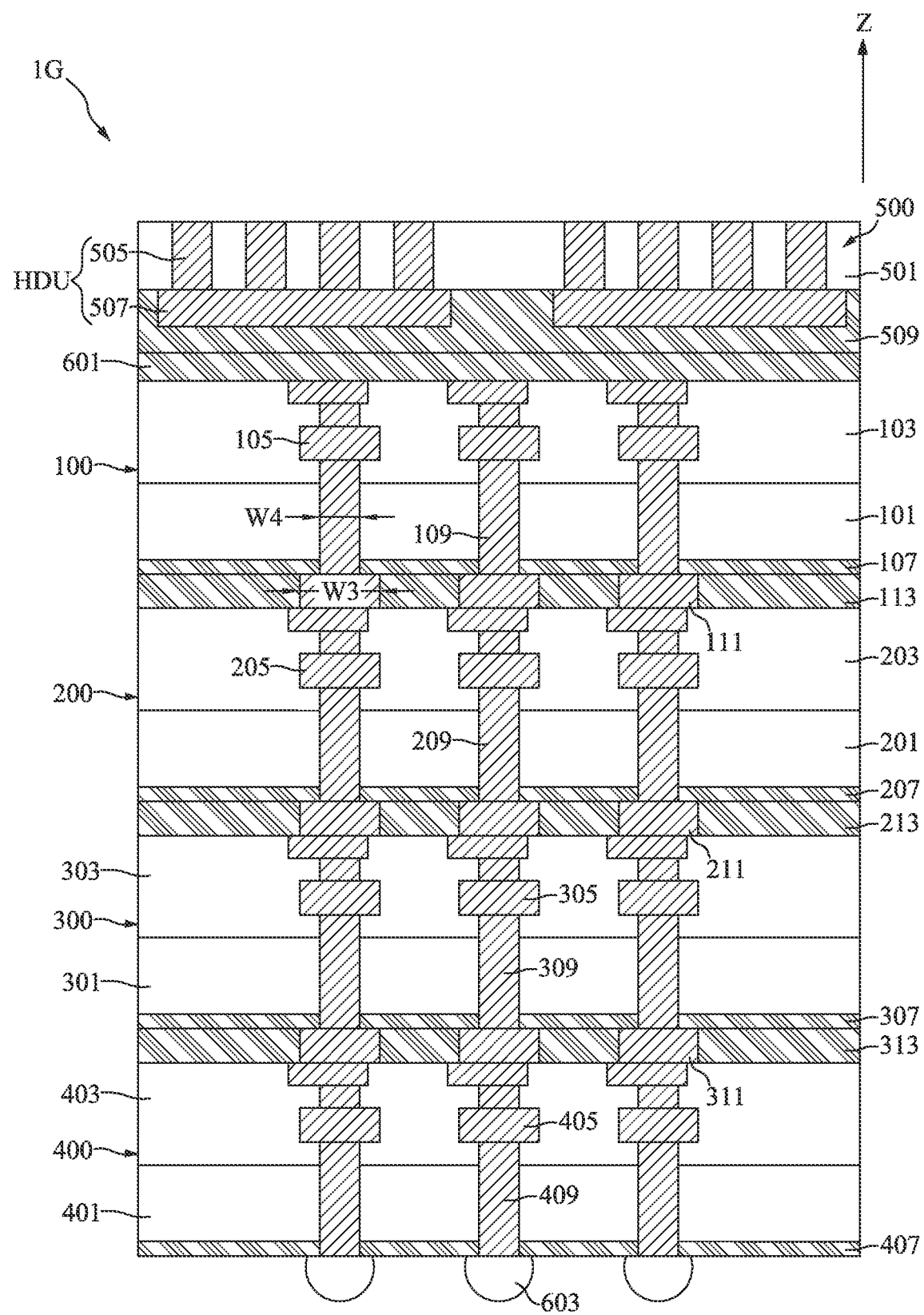

FIGS. 21 and 22 illustrate, in schematic cross-sectional view diagrams, a flow for fabricating a semiconductor device 1G in accordance with another embodiment of the present disclosure.

With reference to FIG. 21, an intermediate semiconductor device may be fabricated with a procedure similar to that illustrated in FIGS. 2 to 13. Pad layers 111 may be formed on the first bonding layer 107. The widths W3 of the pad layers 111 may be greater than the widths W4 of the through semiconductor vias 109. The pad layers 111 may be formed of, for example, tungsten, cobalt, zirconium, tantalum, titanium, aluminum, ruthenium, copper, metal carbides, metal nitrides, transition metal aluminides, or a combination thereof. The greater width of the pad layers 111 may increase the tolerance window for bonding between the first die structure 100 and the second die structure 200. In other words, the alignment requirement between the first die structure 100 and the second interconnection layers 205 may be reduced.

With reference to FIG. 21, a second bonding layer 113 may be formed on the first bonding layer 107 and may cover the pad layers 111. In some embodiments, the second bonding layer 113 may be formed of, for example, a non-organic material selected from un-doped silicate glass, silicon nitride, silicon oxynitride, silicon oxide, silicon nitride oxide, and combinations thereof. In some embodiments, the second bonding layer 113 may be formed of, for example, a polymer layer such as an epoxy, polyimide, benzocyclobutene, polybenzoxazole, or the like. The second bonding layer 113 may be formed by a deposition process such as chemical vapor deposition, plasma-enhanced chemical vapor deposition, evaporation, or spin-on coating. A planarization process, such as chemical mechanical polishing, may be performed to expose top surfaces of the pad layers 111.

With reference to FIG. 22, other elements may be formed with a procedure similar to that illustrated in FIGS. 14 and 15. The pad layers 211 of second die structure 200 and the pad layers 311 of third die structure 300 may have structures similar to the pad layers 111 of first die structure 100. The second bonding layer 213 of second die structure 200 and the second bonding layer 313 of third die structure 300 may have structures similar to the second bonding layer 113 of first die structure 100.

FIGS. 23 to 26 illustrate, in schematic cross-sectional view diagrams, a flow for fabricating a semiconductor device 1H in accordance with another embodiment of the present disclosure.

Figure 23:
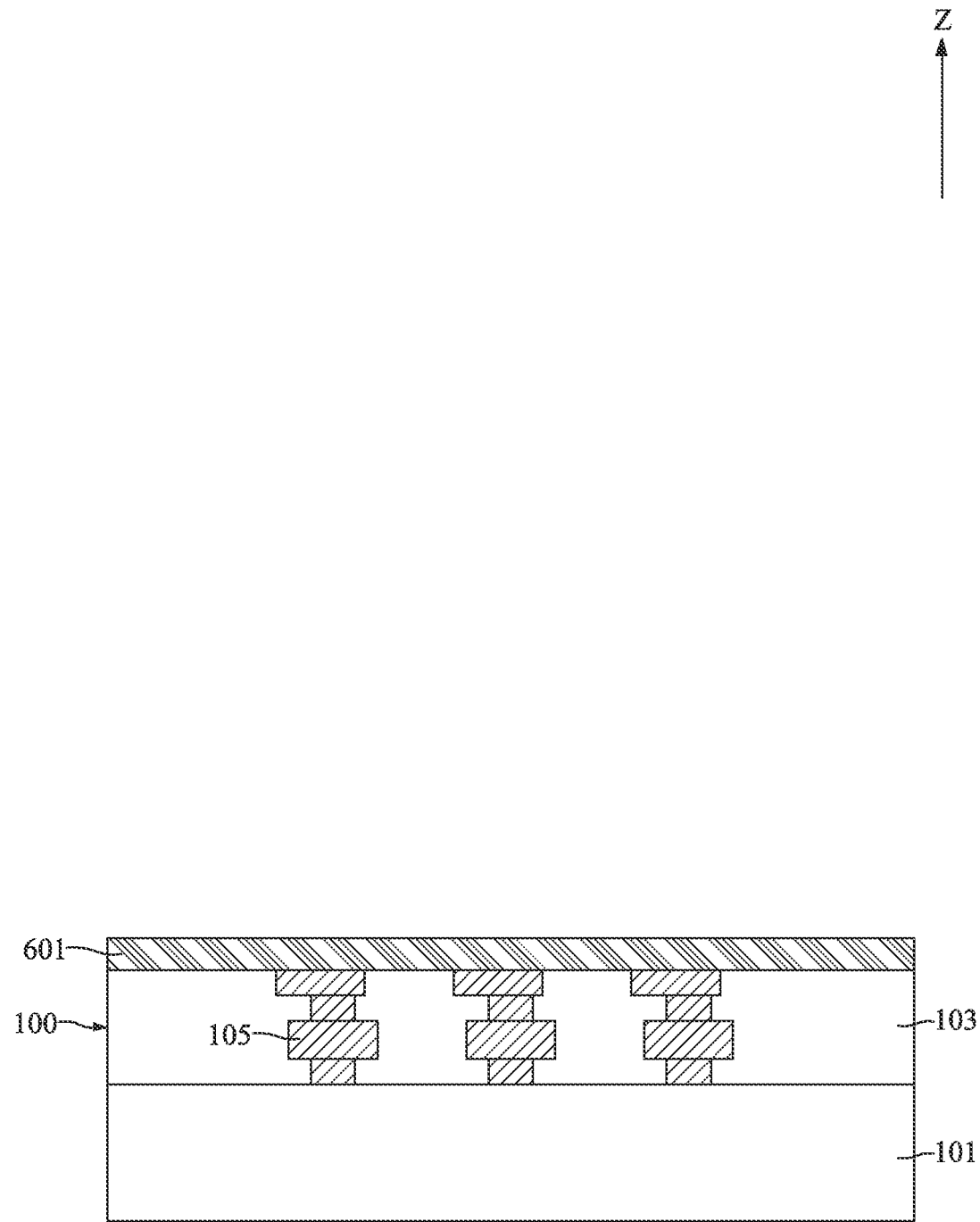
FIGS. 23 to 26 illustrate, in schematic cross-sectional view diagrams, a flow for fabricating a semiconductor device in accordance with another embodiment of the present disclosure.

With reference to FIG. 23, an intermediate semiconductor device may be fabricated with a procedure similar to that illustrated in FIGS. 2 to 9. It should be noted that the through semiconductor vias 109 are not formed in the first substrate 101 in the current stage.

Figure 24:
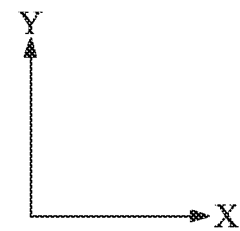
Figure 24:
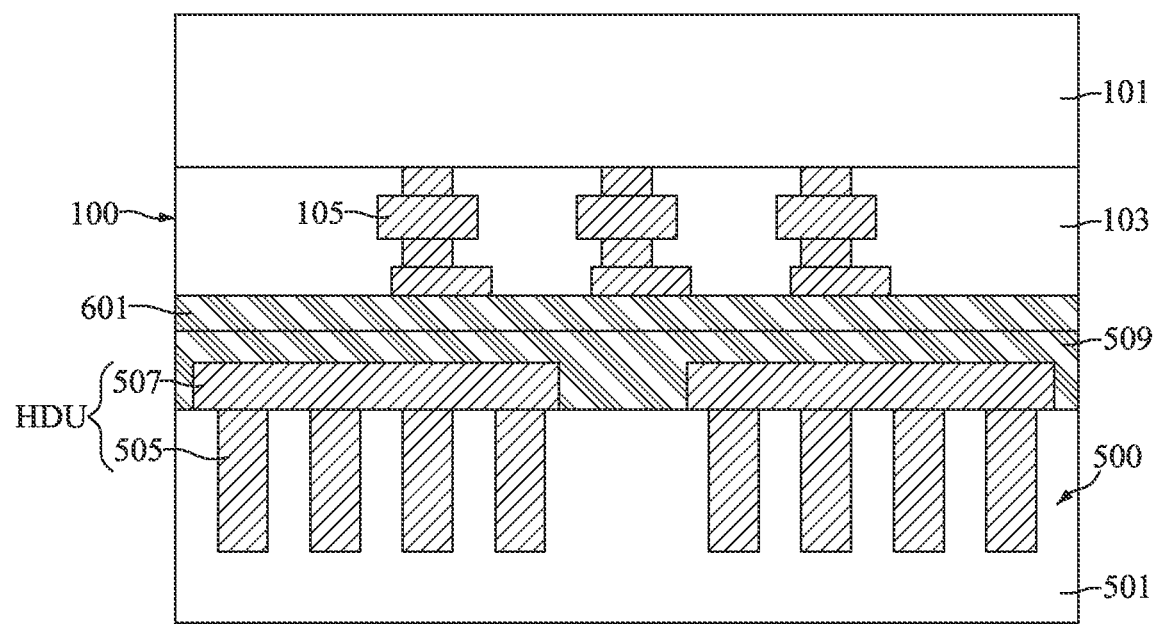

With reference to FIG. 24, the intermediate semiconductor device illustrated in FIG. 23 may be placed up-side down and bonded onto the bonding layer 509.

Figure 25:
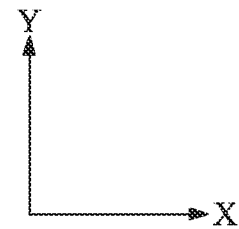
Figure 25:
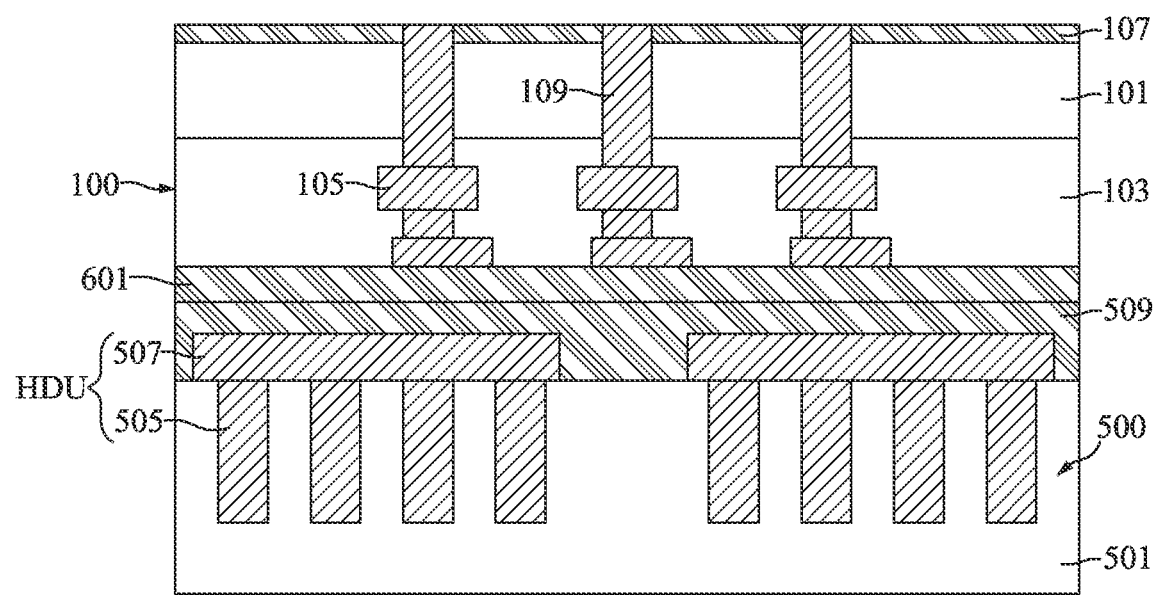

With reference to FIG. 25, a thinning process may be performed on the first substrate 101 using an etching process, a chemical polishing process, or a grinding process to reduce a thickness of the first substrate 101. Subsequently, the through semiconductor vias 109 may be formed in the first substrate 101 and may contact the first interconnection layers 105. The first bonding layer 107 may be formed on the first substrate 101 with a procedure similar to that illustrated in FIGS. 11 to 13.

Figure 26:
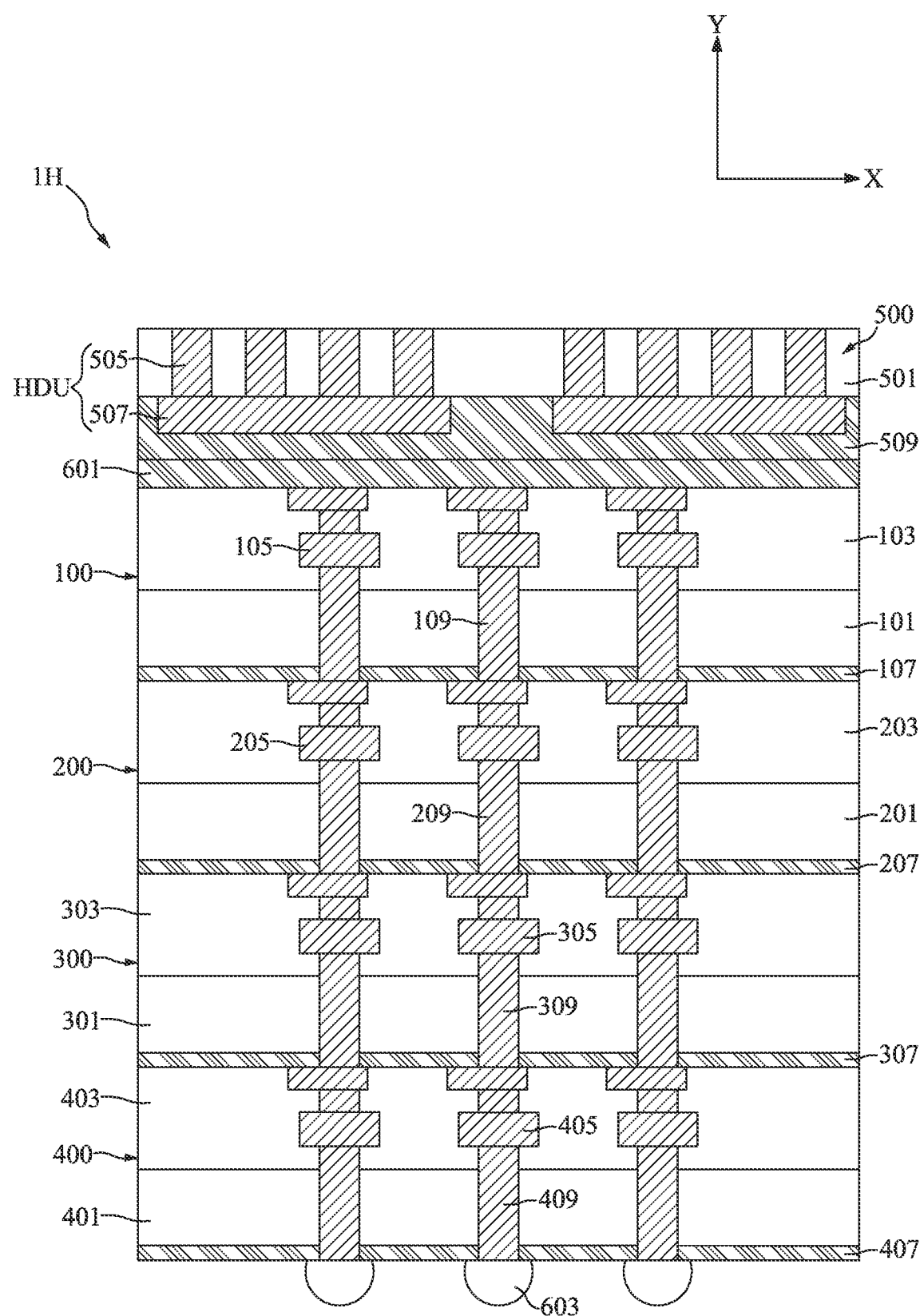

With reference to FIG. 26, the second die structure 200, the third die structure 300, the first bonding layer 407 of fourth die structure 400, and the solder joints 603 may be formed with a procedure similar to that illustrated in FIGS. 14 and 15. It should be noted that the through semiconductor vias 209, the through semiconductor vias 309, and the through semiconductor vias 409 may be respectively formed before bonding of the die structures 200, 300, 400 or may be formed before bonding of the die structures 200, 300, 400.

Figure 27:
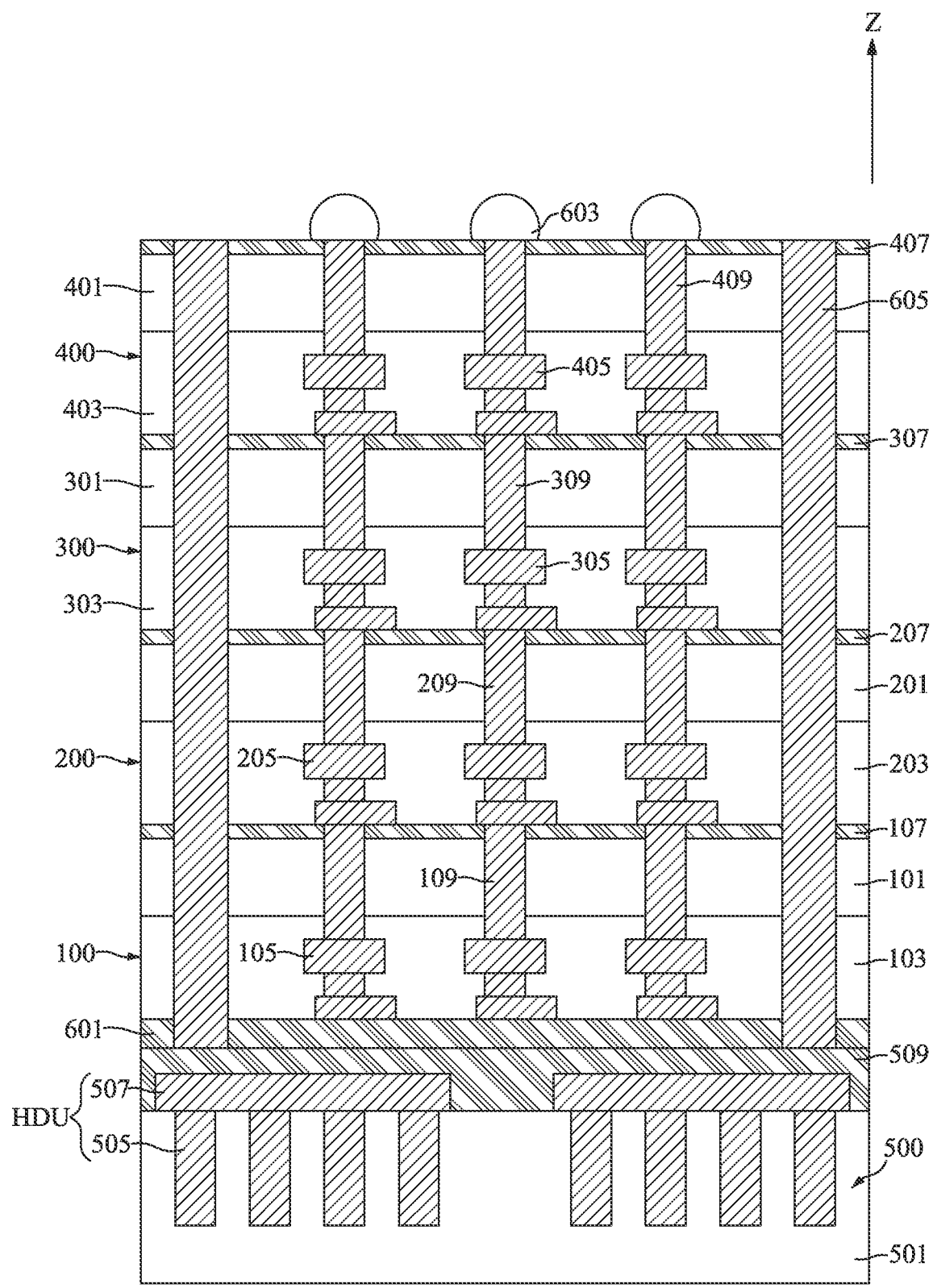
FIGS. 27 and 28 illustrate, in schematic cross-sectional view diagrams, a flow for fabricating a semiconductor device in accordance with another embodiment of the present disclosure.
Figure 28:
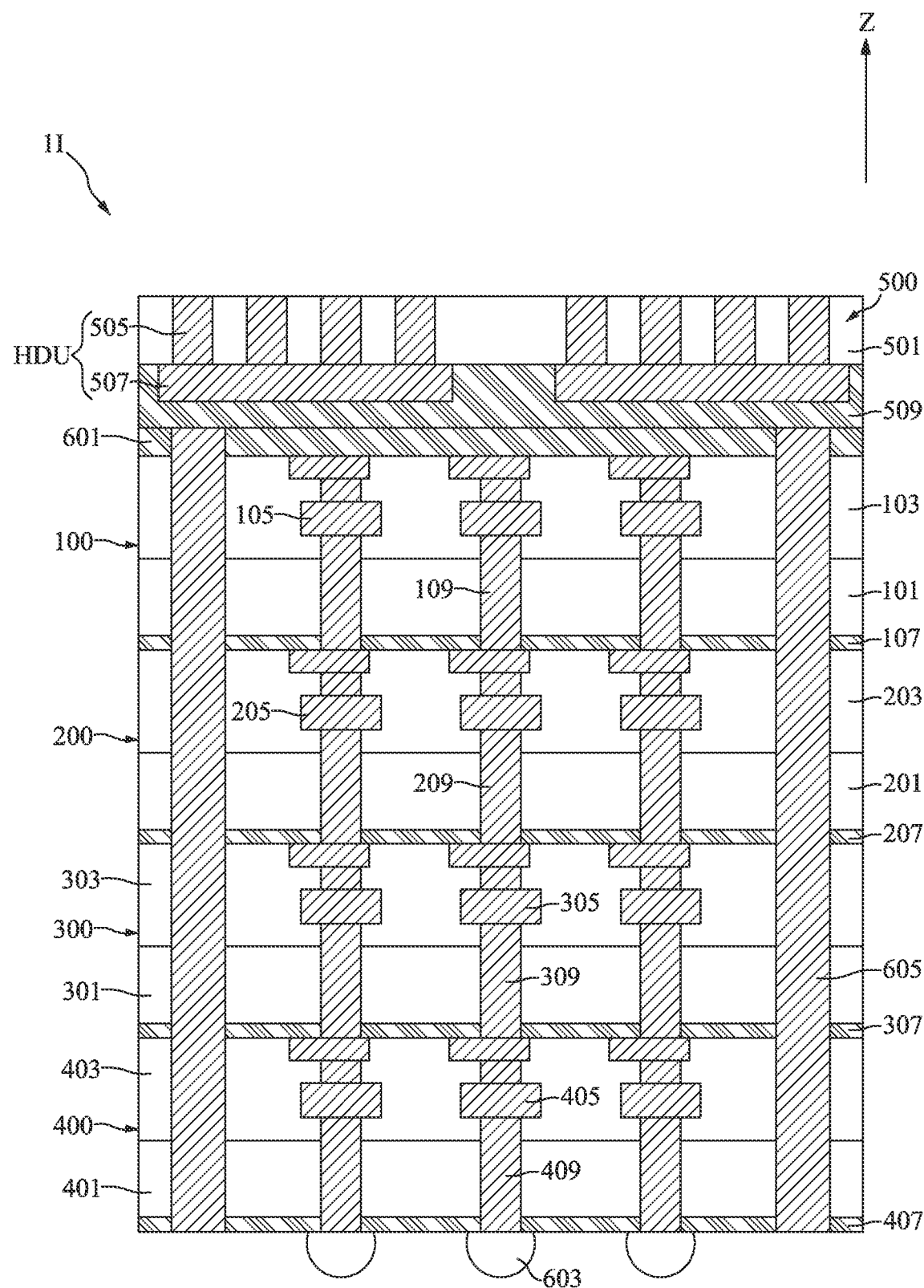

FIGS. 27 and 28 illustrate, in schematic cross-sectional view diagrams, a flow for fabricating a semiconductor device 1I in accordance with another embodiment of the present disclosure.

With reference to FIG. 27, an intermediate semiconductor device may be fabricated with a procedure similar to that illustrated in FIGS. 2 to 14. In some embodiments, first dummy through semiconductor vias 605 may be formed along the fourth die structure 400, the third die structure 300, the second die structure 200, the first die structure 100, and the intervening bonding layer 601. The first dummy through semiconductor vias 605 may be formed after the bonding of the die structures 100, 200, 300, 400. In some embodiments, conductive features may be formed in the die structures 100, 200, 300, 400. After the bonding of the die structures 100, 200, 300, 400, the conductive features may be vertically aligned to configure the first dummy through semiconductor vias 605. The first dummy through semiconductor vias 605 may be formed with a same material as the through semiconductor vias 505 but is not limited thereto.

With reference to FIG. 28, the intermediate semiconductor device illustrated in FIG. 27 may be placed inverted. A planarization process, such as chemical mechanical polishing, may be performed to expose the through semiconductor vias 505. Heat accumulated in the die structures 100, 200, 300, 400 may thermally conduct to the carrier structure 500 through the first dummy through semiconductor vias 605.

Figure 29:
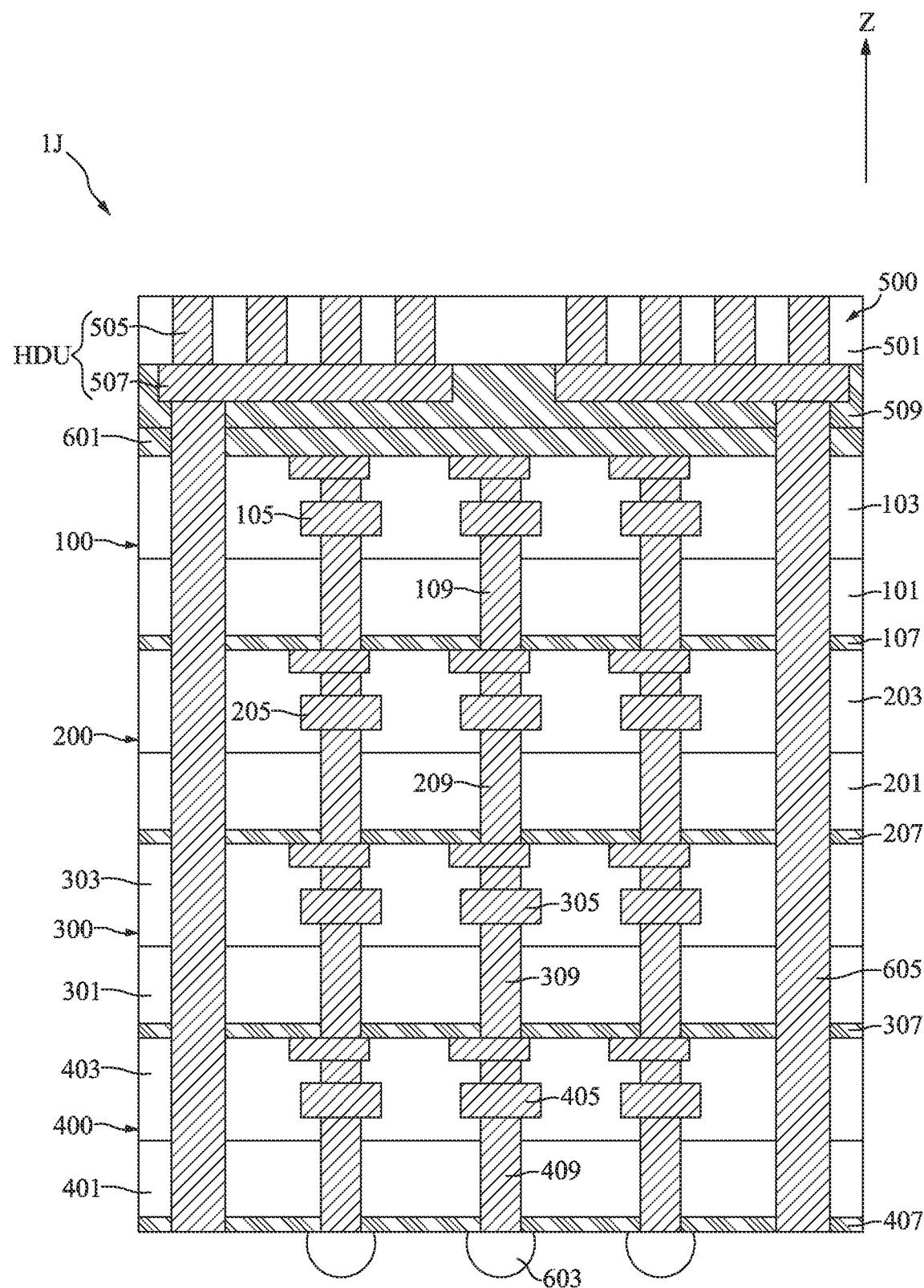
FIG. 29 illustrates, in a schematic cross-sectional view diagrams, a semiconductor device in accordance with another embodiment of the present disclosure.

FIG. 29 illustrates, in a schematic cross-sectional view diagrams, a semiconductor device 1J in accordance with another embodiment of the present disclosure.

With reference to FIG. 29, the semiconductor device 1J may have a structure similar to that illustrated in FIG. 28. The same or similar elements in FIG. 29 as in FIG. 28 have been marked with similar reference numbers and duplicative descriptions have been omitted. The first dummy through semiconductor vias 605 may contact the conductive plates 507. Heat accumulated in the die structures 100, 200, 300, 400 may thermally conduct to the heat dissipation unit HDU of the carrier structure 500 through the first dummy through semiconductor vias 605.

Figure 30:
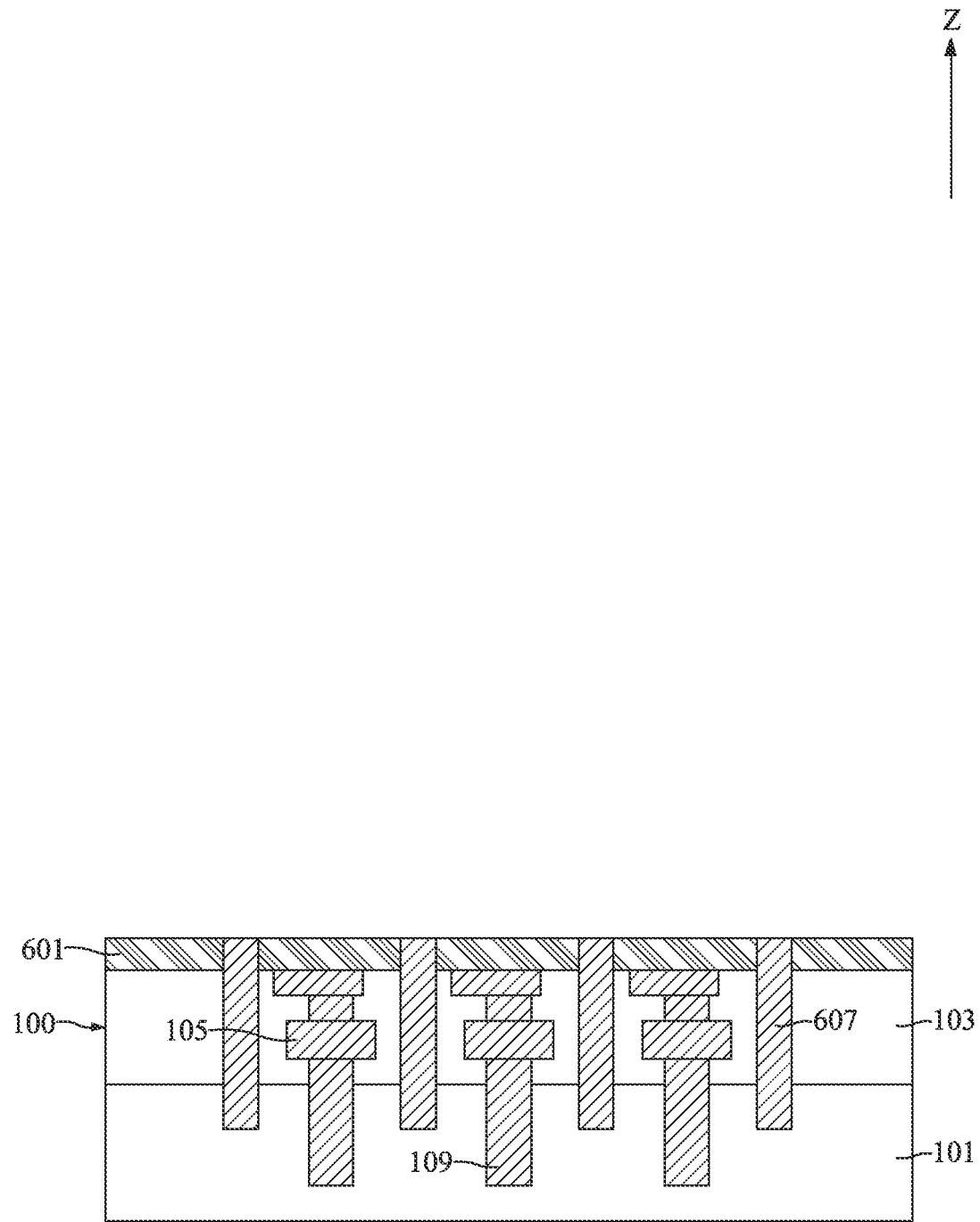
FIGS. 30 and 31 illustrate, in schematic cross-sectional view diagrams, a flow for fabricating a semiconductor device in accordance with another embodiment of the present disclosure.
Figure 31:
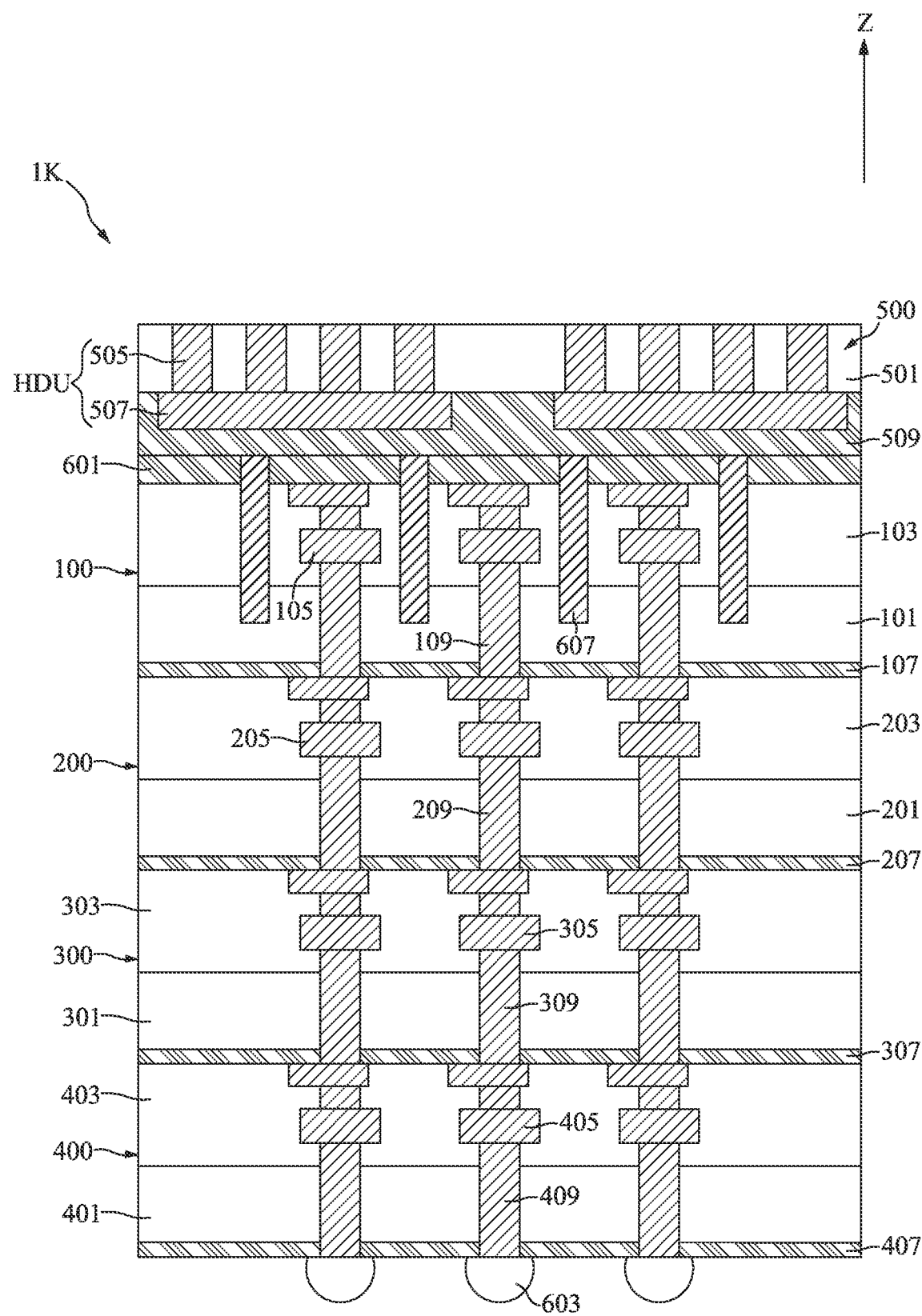

FIGS. 30 and 31 illustrate, in schematic cross-sectional view diagrams, a flow for fabricating a semiconductor device 1K in accordance with another embodiment of the present disclosure.

With reference to FIG. 30, an intermediate semiconductor device may be fabricated with a procedure similar to that illustrated in FIGS. 2 to 9. Second dummy through semiconductor vias 607 may be formed along the intervening bonding layer 601 and the first dielectric layer 103 and extending to the first substrate 101. In some embodiments, the second dummy through semiconductor vias 607 may be formed along the intervening bonding layer 601 and extending to the first dielectric layer 103. The second dummy through semiconductor vias 607 may be formed of a same material as the through semiconductor vias 109 but is not limited thereto. In some embodiments, the second dummy through semiconductor vias 607 substantially uniformly distributed in the first die structure 100.

With reference to FIG. 31, other elements may be formed with a procedure similar to that illustrated in FIGS. 10 to 15. Heat accumulated in the first die structure 100 may thermally conduct to the carrier structure 500 through the second dummy through semiconductor vias 607.

Figure 32:
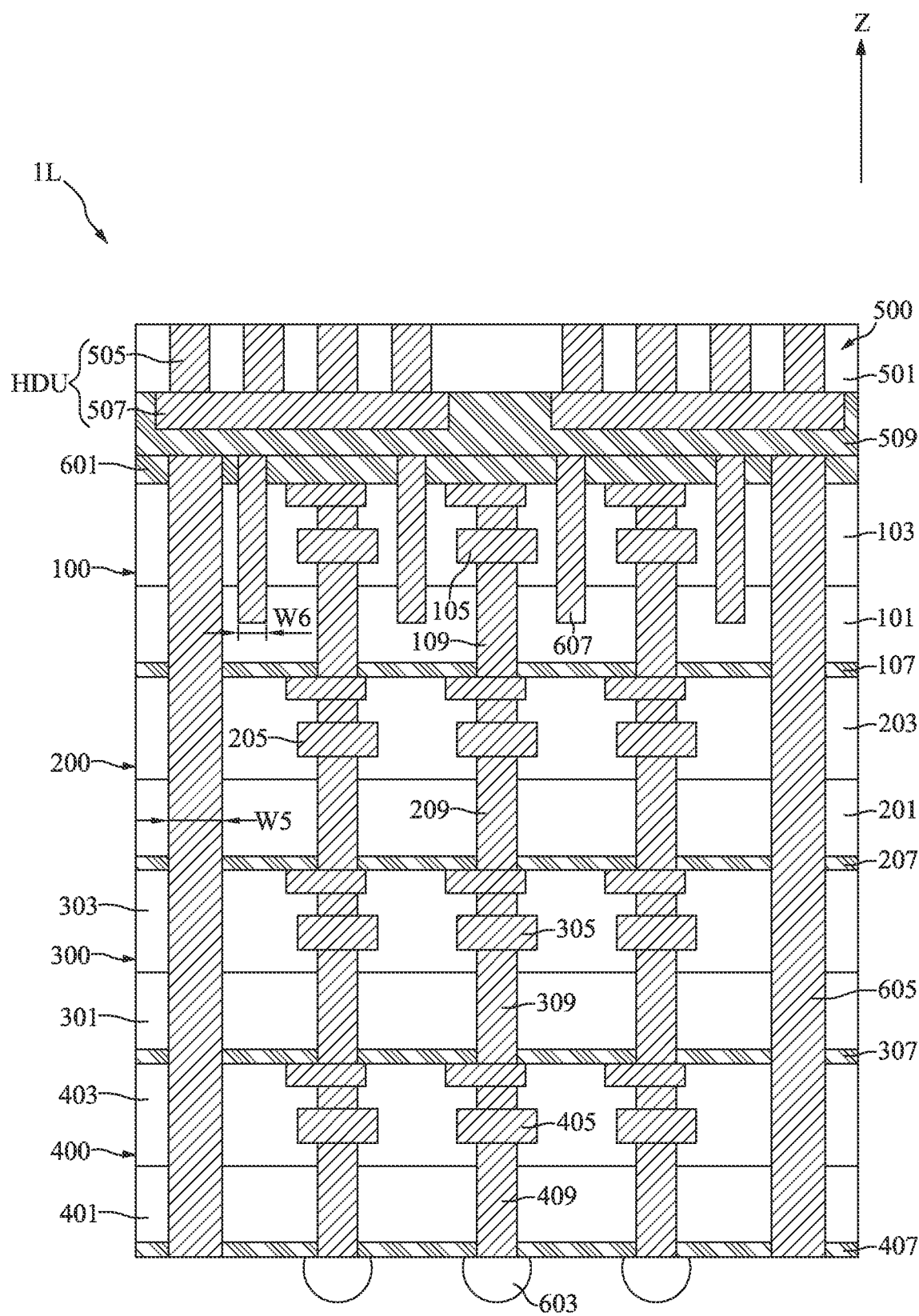
FIGS. 32 to 34 illustrate, in schematic cross-sectional view diagrams, semiconductor devices in accordance with some embodiments of the present disclosure.
Figure 33:
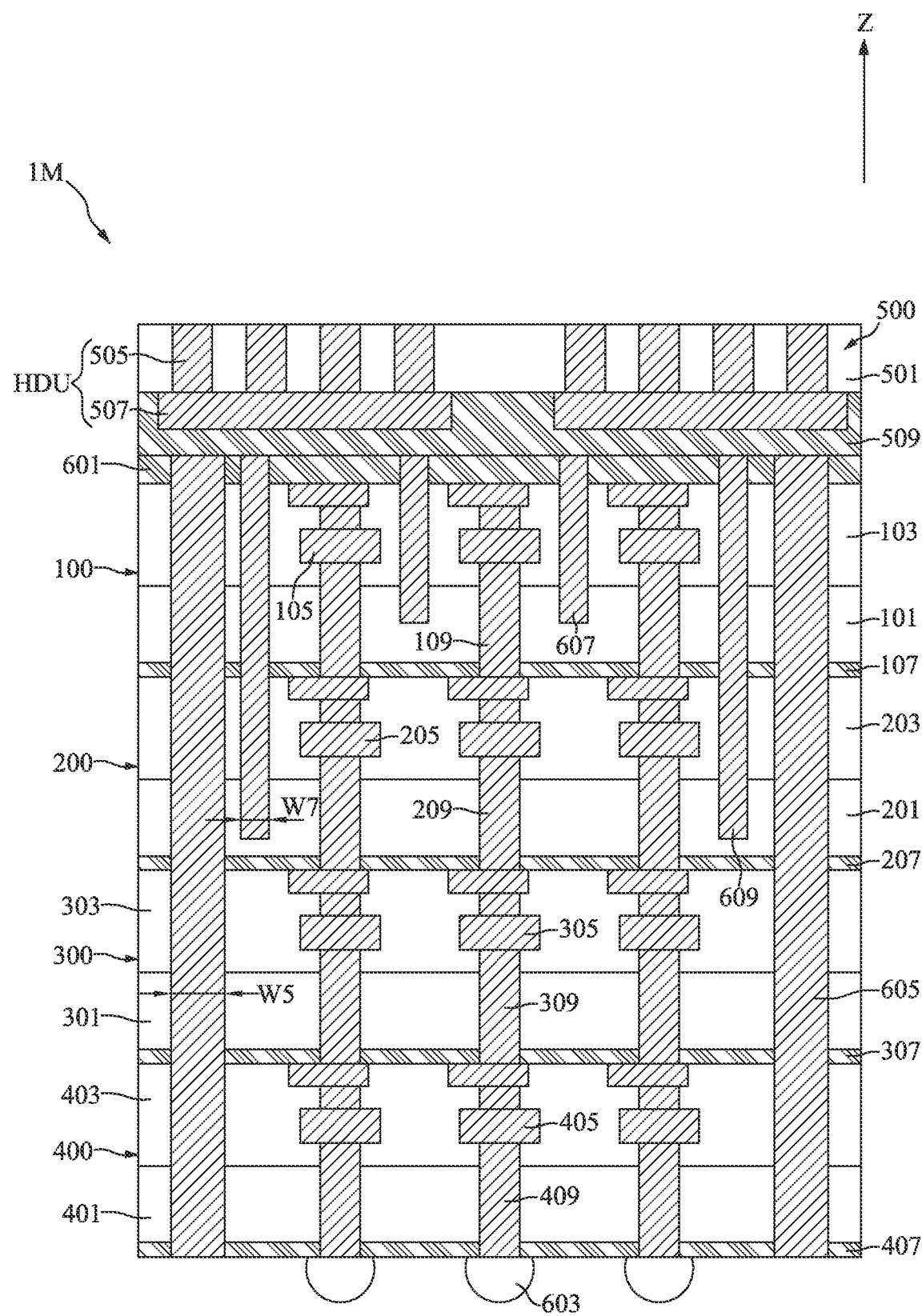
Figure 34:
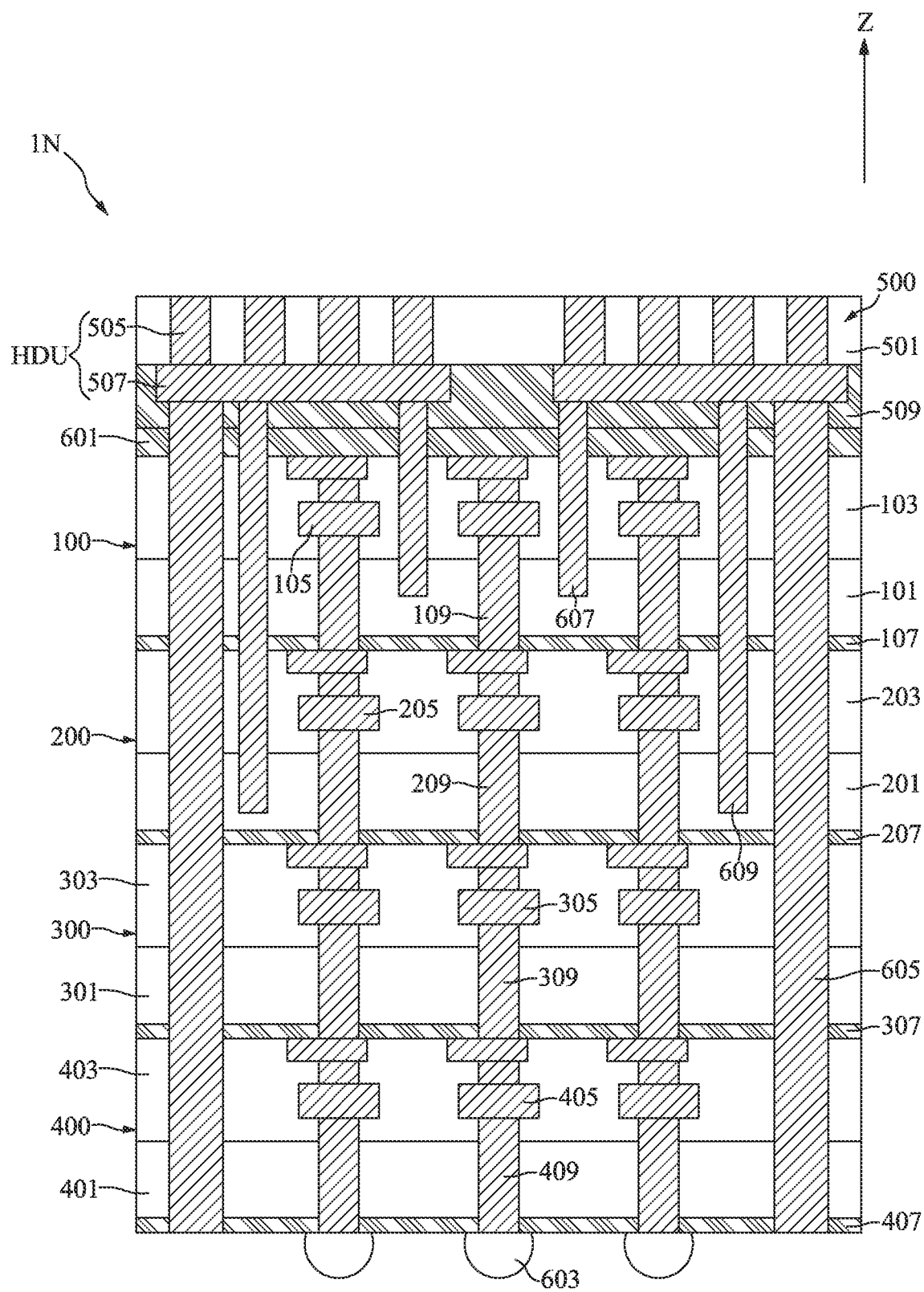

FIGS. 32 to 34 illustrate, in schematic cross-sectional view diagrams, semiconductor devices 1L, 1M, 1N in accordance with some embodiments of the present disclosure.

With reference to FIG. 32, the semiconductor device 1L may have a structure similar to that illustrated in FIG. 15. The same or similar elements in FIG. 32 as in FIG. 15 have been marked with similar reference numbers and duplicative descriptions have been omitted. The semiconductor device 1L may include the first dummy through semiconductor vias 605 and the second dummy through semiconductor vias 607. The first dummy through semiconductor vias 605 may be disposed along the intervening bonding layer 601, the first die structure 100, the second die structure 200, the third die structure 300, and the fourth die structure 400. The second dummy through semiconductor vias 607 may be disposed along the intervening bonding layer 601 and the first dielectric layer 103 and extending to the first substrate 101. That is, the depths of the first dummy through semiconductor vias 605 may be greater than the depths of the second dummy through semiconductor vias 607. The widths W5 of the first dummy through semiconductor vias 605 may be greater than or equal to the widths W6 of the second dummy through semiconductor vias 607.

With reference to FIG. 33, the semiconductor device 1M may have a structure similar to that illustrated in FIG. 32. The same or similar elements in FIG. 33 as in FIG. 32 have been marked with similar reference numbers and duplicative descriptions have been omitted. The semiconductor device 1M further include third dummy through semiconductor vias 609. The third dummy through semiconductor vias 609 may be disposed along the first die structure 100 and the second dielectric layer 203 and extending to the second substrate 201. The depths of the third dummy through semiconductor vias 609 may be greater than the depths of the second dummy through semiconductor vias 607. The widths W5 of the first dummy through semiconductor vias 605 may be greater than or equal to the widths W7 of the third dummy through semiconductor vias 609.

With reference to FIG. 34, the semiconductor device 1N may have a structure similar to that illustrated in FIG. 33. The same or similar elements in FIG. 34 as in FIG. 33 have been marked with similar reference numbers and duplicative descriptions have been omitted. The first dummy through semiconductor vias 605, the second dummy through semiconductor vias 607, and the third dummy through semiconductor vias 609 may contact the conductive plates 507 for more efficient thermal conduction.

One aspect of the present disclosure provides a semiconductor device including a die stack, an intervening bonding layer positioned on the die stack, and a carrier structure including a carrier substrate positioned on the intervening bonding layer, and through semiconductor vias positioned in the carrier substrate and on the intervening bonding layer for thermally conducting heat.

Another aspect of the present disclosure provides a method for fabricating a semiconductor device including providing a carrier substrate, forming through semiconductor vias in the carrier substrate for thermally conducting heat, forming a bonding layer on the carrier substrate, providing a first die structure including through semiconductor vias, forming an intervening bonding layer on the first die structure, bonding the first die structure onto the bonding layer through the intervening bonding layer, and bonding a second die structure onto the first die structure. The carrier substrate, the through semiconductor vias, and the bonding layer together configure a carrier structure. The second die structure and the first die structure are electrically coupled by the through semiconductor vias.

Due to the design of the semiconductor device of the present disclosure, heat accumulated during the operation of the semiconductor device 1A may be thermally conducted to the ambient through the conductive plates 507 and the through semiconductor vias 505 (i.e., the heat dissipation unit HDU). That is, the thermal conducting capability of the semiconductor device 1A may be improved.

Although the present disclosure and its advantages have been described in detail, it should be understood that various changes, substitutions, and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a die stack;
an intervening bonding layer positioned on the die stack; and
a carrier structure comprising:
  a carrier substrate positioned on the intervening bonding layer, and
  through semiconductor vias positioned in the carrier substrate and on the intervening bonding layer for thermally conducting heat;
wherein the carrier structure comprises:
  a bonding layer positioned between the carrier substrate and the intervening bonding layer; and
  a conductive plate positioned in the bonding layer of the carrier structure and contacting the through semiconductor vias of the carrier structure;
wherein the die stack comprises:
  a first die structure positioned below the intervening bonding layer; and
  a second die structure positioned below the first die structure;
wherein the first die structure comprises:
  a first substrate positioned opposite to the intervening bonding layer;
  a first dielectric layer positioned between the first substrate and the intervening bonding layer;
  a first bonding layer positioned between the first substrate and the second die structure;
  first interconnection layers positioned in the first dielectric layer;
  through semiconductor vias of the first die structure positioned along the first substrate and the first bonding layer of the first die structure and electrically connecting the first interconnection layers and the second die structure;

wherein the second die structure comprises:
   a second substrate positioned opposite to the first bonding layer of the first die structure;
   a second dielectric layer positioned between the second substrate and the first bonding layer of the first die structure;
   a first bonding layer of the second die structure positioned below the second substrate;
   second interconnection layers positioned in the second dielectric layer and electrically connecting to the through semiconductor vias of the first die structure; and
   through semiconductor vias of the second die structure positioned along the second substrate and the first bonding layer of the second die structure and electrically connecting to the second interconnection layers.

2. The semiconductor device of claim 1, wherein the first die structure and the second die structure are memory dies.

3. The semiconductor device of claim 1, wherein the first die structure is a memory die and the second die structure is a logic die.

4. The semiconductor device of claim 1, wherein top surfaces of the through semiconductor vias of the carrier structure and a top surface of the carrier substrate are substantially coplanar.

5. The semiconductor device of claim 1, wherein top surfaces of the through substrate vias of the carrier structure are covered by the carrier substrate.

6. The semiconductor device of claim 1, further comprising solder joints electrically connecting to the through semiconductor vias of the second die structure.

7. The semiconductor device of claim 1, wherein the first die structure comprises:
   a second bonding layer positioned between the first bonding layer of the first die structure and the second dielectric layer; and
   pad layers positioned in the second bonding layer and electrically connecting the second interconnection layers and the through semiconductor vias of the first die structure.

8. The semiconductor device of claim 7, wherein widths of the pad layers are greater than widths of the through semiconductor vias of the first die structure.

9. The semiconductor device of claim 1, further comprising first dummy through semiconductor vias positioned along the first die structure, the second die structure, and the intervening bonding layer.

10. The semiconductor device of claim 1, further comprising first dummy through semiconductor vias positioned along the first die structure, the second die structure, and the intervening bonding layer, extending to the bonding layer of the carrier structure, and thermally contacting with the conductive plate.

11. The semiconductor device of claim 9, further comprising second dummy through semiconductor vias positioned along the intervening bonding layer and the first dielectric layer and extending to the first substrate.

12. The semiconductor device of claim 11, wherein widths of the first dummy through semiconductor vias are greater than widths of the second dummy through semiconductor vias.

13. The semiconductor device of claim 11, further comprising third dummy through semiconductor vias positioned along the first die structure and extending to the second die structure.

14. The semiconductor device of claim 11, wherein the second dummy through semiconductor vias are substantially uniformly distributed in the first die structure.

15. The semiconductor device of claim 1, further comprising a thermal interface layer positioned between the intervening bonding layer and the bonding layer of the carrier substructure, wherein the thermal interface layer is formed of a carbon material imbued with a flexible material.

16. A semiconductor device, comprising:
   a die stack;
   an intervening bonding layer positioned on the die stack; and
   a carrier structure comprising:
      a carrier substrate positioned on the intervening bonding layer;
      through semiconductor vias positioned in the carrier substrate and on the intervening bonding layer for thermally conducting heat;
      a bonding layer positioned between the carrier substrate and the intervening bonding layer; and
      conductive fins positioned in the bonding layer of the carrier structure and contacting with the through semiconductor vias of the carrier structure.

* * * * *